US011670642B2

(12) United States Patent
Choi et al.

(10) Patent No.: US 11,670,642 B2
(45) Date of Patent: Jun. 6, 2023

(54) LIGHT EMITTING DISPLAY APPARATUS

(71) Applicant: LG Display Co., Ltd., Seoul (KR)

(72) Inventors: Mingeun Choi, Paju-si (KR); HeeJung Yang, Paju-si (KR); Sookang Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 185 days.

(21) Appl. No.: 17/120,746

(22) Filed: Dec. 14, 2020

(65) Prior Publication Data

US 2021/0183900 A1 Jun. 17, 2021

(30) Foreign Application Priority Data

Dec. 17, 2019 (KR) .................. 10-2019-0169152

(51) Int. Cl.
*H01L 27/12* (2006.01)
*H01L 27/32* (2006.01)

(52) U.S. Cl.
CPC ........ *H01L 27/124* (2013.01); *H01L 27/3276* (2013.01)

(58) Field of Classification Search
CPC ............................ H01L 27/124; H01L 27/3276
USPC .......................................................... 257/79
See application file for complete search history.

(56) References Cited

U.S. PATENT DOCUMENTS

| 10,204,966 B2 | 2/2019 | Choi et al. |
| 2009/0206733 A1* | 8/2009 | Hwang ............... H01L 51/5265 445/24 |
| 2017/0125506 A1 | 5/2017 | Kim |
| 2019/0096976 A1 | 3/2019 | Jang et al. |
| 2019/0206949 A1 | 7/2019 | Park et al. |

FOREIGN PATENT DOCUMENTS

| JP | 2003-303687 A | 10/2003 |
| JP | 2006-286227 A | 10/2006 |
| JP | 2014-186258 A | 10/2014 |
| JP | 2015-79207 A | 4/2015 |
| JP | 2016-75868 A | 5/2016 |
| KR | 10-2017-0052467 A | 5/2017 |
| KR | 10-2018-0025054 A | 3/2018 |
| WO | WO 2017/094760 A1 | 6/2017 |

* cited by examiner

*Primary Examiner* — Ori Nadav
(74) *Attorney, Agent, or Firm* — Birch, Stewart, Kolasch & Birch LLP

(57) ABSTRACT

A light emitting display apparatus includes a substrate, a first metal line and a second metal line spaced apart from each other along a first direction on the substrate and disposed along a second direction crossing the first direction, and a subpixel overlapped with at least one of the first metal line and the second metal line. The subpixel includes a first light emission portion between the first metal line and the second metal line, and a second light emission portion overlapped with at least one of the first metal line and the second metal line.

17 Claims, 11 Drawing Sheets

LIGHT EMITTING DISPLAY APPARATUS

CROSS-REFERENCE TO RELATED APPLICATIONS

This application claims the benefit of priority to Korean Patent Application No. 10-2019-0169152 filed on Dec. 17, 2019, the entire contents of which are hereby expressly incorporated by reference into the present application.

BACKGROUND

Technical Field

The present disclosure relates to a light emitting display apparatus.

Description of the Related Art

A light emitting display apparatus is a self-light emitting display apparatus, and can be manufactured at a lightweight and slim size as it does not need a separate light source unlike a liquid crystal display (LCD) apparatus. Also, the light emitting display apparatus has good characteristics in view of power consumption due to low voltage driving and have good characteristics for color realization, a response speed, a viewing angle, and a contrast ratio, and thus attracts attention as a next-generation display apparatus.

The light emitting display apparatus displays an image through light emission of a light emitting device layer that includes a light emitting device interposed between two electrodes. For example, light generated in accordance with light emission of the light emitting device is emitted to the outside through an electrode, a substrate, etc.

Recently, a light emitting display apparatus in which a white subpixel is added to a unit pixel having red, green and blue subpixels has been suggested.

Although the light emitting display apparatus that includes a white subpixel can improve luminance and a color temperature of a display image through the white subpixel, a trade off relation is formed between luminance of a pure color such as red, green and blue and luminance of a white color. For example, if luminance and the color temperature of the white subpixel are increased, efficiency in the red and green subpixels can be reduced, whereby total performance of the light emitting display apparatus can be deteriorated.

SUMMARY

Accordingly, the present disclosure is directed to providing a display apparatus that substantially obviates one or more problems due to limitations and disadvantages of the related art.

A light emitting display apparatus according to the background art can have problems and limitations as follows. Some of the light emitted from a light emitting device may not be emitted to the outside due to the total reflection on an interface between the light emitting device and an electrode and/or an interface between a substrate and an air layer, whereby light extraction efficiency is reduced. For example, in a general light emitting display apparatus, light of 80% of light emitted from the light emitting device may not bet emitted (or extracted) to the outside but trapped in the light emitting device, and light of 20% may only be extracted to the outside. In order to improve light extraction efficiency of the light emitting display apparatus, a light emitting display apparatus in which a fine structure, for example, a microlens or uneven pattern is applied to an opening (or light emitting portion) has been suggested.

A light emitting display apparatus in which a fine structure is applied to a subpixel can generate a difference in a luminance increase rate between wavelength ranges in a white spectrum. For this reason, a difference in an efficiency increase rate among red, green and blue can occur, whereby luminance and a color temperature of a display image can be reduced. For example, in the light emitting display apparatus in which a fine structure is applied to a subpixel, a color temperature of a white subpixel can be lowered due to a blue luminance increase rate, whereby efficiency of the light emitting display apparatus can be reduced.

An aspect of the present disclosure to provide a light emitting display apparatus in which luminance and a color temperature of a white subpixel can be improved.

Another aspect of the present disclosure to provide a light emitting display apparatus in which luminance and a color temperature of a display image can be improved.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other aspects of the inventive concepts as embodied and broadly described, a light emitting display apparatus comprises a substrate, a first metal line and a second metal line spaced apart from each other along a first direction on the substrate and disposed along a second direction crossing the first direction, and a subpixel overlapped with at least one of the first metal line and the second metal line, wherein the subpixel includes a first light emission portion between the first metal line and the second metal line, and a second light emission portion overlapped with at least one of the first metal line and the second metal line.

In another aspect of the present disclosure, a light emitting display apparatus comprises a substrate having a plurality of subpixel areas disposed along a first direction and a second direction crossing the first direction, a plurality of metal lines longitudinally extended along the second direction and disposed in the plurality of subpixel areas, and a light emission portion disposed in each of the plurality of subpixel areas, wherein the light emission portion disposed in some subpixel areas of the plurality of subpixel areas is overlapped with at least one metal line adjacent thereto along the first direction among the plurality of metal lines.

In the light emitting display apparatus according to the present disclosure, luminance and a color temperature of a white subpixel can be improved, whereby a display image of which luminance and color temperature have been improved can be disposed or displayed.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE DISCLOSURE

Figure 1:
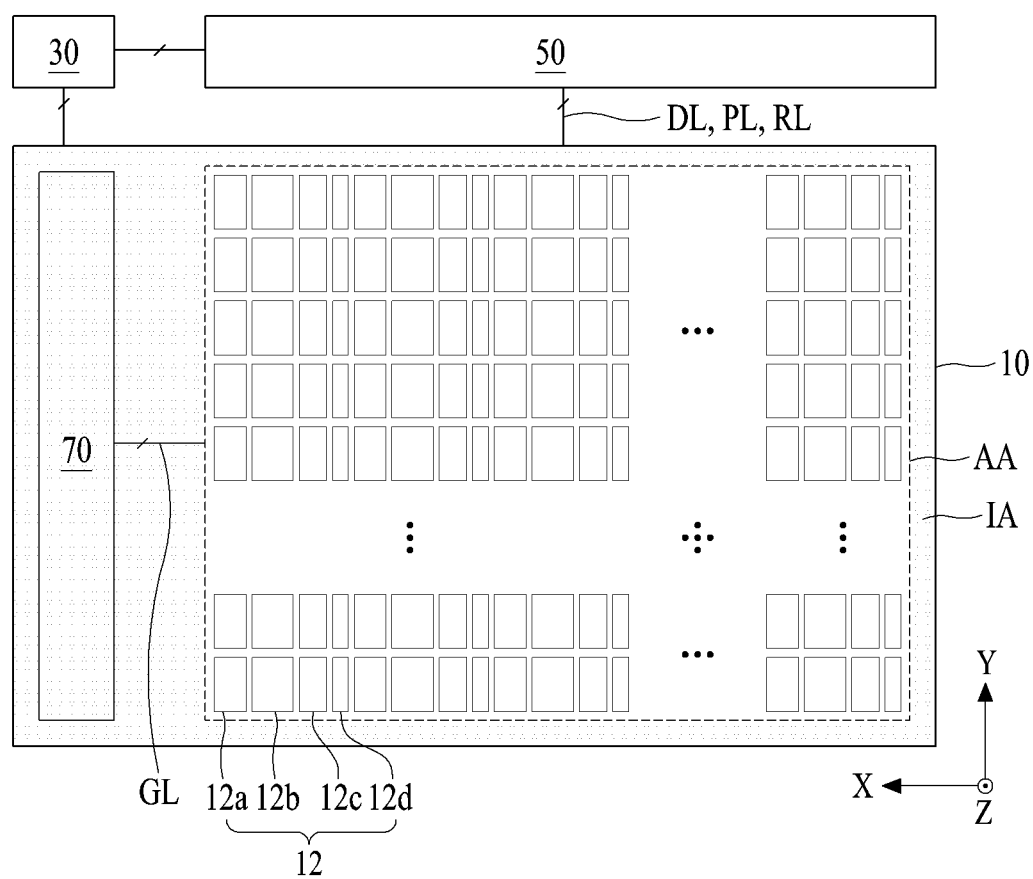
FIG. 1 is a schematic view illustrating a light emitting display apparatus according to one or more embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a positional relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first," "second," and the like can be used herein to describe various elements, these elements should not be limited by these terms and may not define any order. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, exemplary embodiments of a light emitting display apparatus according to the present disclosure will be described in detail with reference to the accompanying drawings. In adding reference numerals to elements in the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

FIG. 1 is a schematic view illustrating a light emitting display apparatus according to one or more embodiments of the present disclosure. All the components of the light emitting display apparatus according to all embodiments of the present disclosure are operatively coupled and configured.

Referring to FIG. 1, the light emitting display apparatus according to one embodiment of the present disclosure can include a display panel 10, a control circuit 30, a data driving circuit 50, and a gate driving circuit 70.

The display panel 10 can include a display area AA (or active area) defined on a substrate, and a non-display area IA (or inactive area) surrounding the display area AA.

The display area AA can include a plurality of subpixels 12*a*, 12*b*, 12*c* and 12*d* disposed in an area defined by m number of gate lines GL and n number of data lines DL, where n can be a positive number such as a positive integer.

Each of the n number of gate lines GL can longitudinally be extended along a first direction X, and can be spaced apart from another gate line along a second direction Y crossing the first direction X. For example, each of the n number gate lines GL can include first and second gate lines.

Each of the m number of data lines DL can longitudinally be extended along the second direction Y, and can be spaced apart from another data line along the first direction X.

The display area AA can further include a plurality of pixel driving voltage lines PL and a plurality of reference voltage lines RL, which are disposed in parallel with the data lines DL. Each of the n number gate lines GL can include intersection portions that cross each of the m number of data lines DL, the plurality of pixel driving voltage lines P L and the plurality of reference voltage lines RL. The intersection portion of each of the n number of gate lines GL can include at least one slit or opening for minimizing an overlap area with the other lines.

Each of the plurality of subpixels 12*a*, 12*b* and 12*c* and 12*d* displays a color image corresponding to a gate signal supplied from the gate line GL adjacent thereto and a data voltage supplied from the data line DL adjacent thereto.

The subpixels 12*a*, 12*b* and 12*c* and 12*d* can be arranged adjacent to each other along the length direction X of the gate line GL.

Each of the plurality of subpixels 12*a*, 12*b* and 12*c* and 12*d* can include a pixel circuit disposed in a circuit area (or non-light emitting portion) of a subpixel area, and a light emitting device layer disposed in an opening area (or light emitting portion) of the subpixel area and electrically connected to the pixel circuit.

The pixel circuit can include at least two transistors (or thin-film transistors) and at least one capacitor.

The light emitting device layer can include a self-light emitting device that self-emits light by means of a data signal supplied from the pixel circuit to display an image.

Each of the plurality of subpixels 12*a*, 12*b* and 12*c* and 12*d* can be defined as a minimum unit area where light is actually emitted. In this case, at least four pixels adjacent to each other can constitute one unit pixel 12 for displaying a color image.

One unit pixel 12 according to one embodiment can include first to fourth subpixels 12*a*, 12*b*, 12*c* and 12*d* arranged adjacent to each other along the length direction of the gate line GL. For example, the first subpixel 12*a* can be a red subpixel or a first color subpixel, the second subpixel 12*b* can be a white subpixel or a second color subpixel, the third subpixel 12*c* can be a blue subpixel or a third color subpixel, and the fourth subpixel 12*d* can be a green subpixel or a fourth color subpixel.

The light emitting device layers respectively disposed in the first to fourth subpixels 12*a*, 12*b* and 12*c* and 12*d* can individually emit light of different colors or can commonly emit white light.

According to one embodiment, when the light emitting device layers of the first to fourth subpixels 12*a*, 12*b* and 12*c* and 12*d* commonly emit white light, the first to fourth subpixels 12*a*, 12*b* and 12*c* and 12*d* can respectively include different color filters (or wavelength conversion members) that convert white light into light of different colors. In this case, the second subpixel 12*b* according to one embodiment may not include a color filter. At least a portion of the second subpixel 12*b* according to one embodiment can include the same color filter as any one of the first, third and fourth subpixels 12*a*, 12*c* and 12*d*.

The control circuit 30 can generate a data signal per pixel corresponding to each of the plurality of subpixels 12*a*, 12*b*, 12*c* and 12*d* based on an image signal. The control circuit 30 according to one embodiment can extract white pixel data based on image signals, for example, red input data, green input data and blue input data of each unit pixel 12, respectively calculate red pixel data, green pixel data and blue pixel data by reflecting offset data based on the extracted white pixel data in the red input data, the green input data and the blue input data, align the calculated red, green, blue and white pixel data to be suitable for a pixel arrangement structure and supply the aligned data to the data driving circuit 50. For example, the control circuit 30 can convert the red, green and blue input data to four red, green, blue and white colored data in accordance with a data conversion method disclosed in the Korean Patent Publication No. 10-2013-0060476 or 10-2013-0030598, and the contents of these publications are incorporated by reference into the present application.

The control circuit 30 can drive the gate driving circuit 70 and the data driving circuit 50 in a display mode or a sensing mode. The control circuit 30 can generate each of data control signal and gate control signal for driving each of the gate driving circuit 70 and the data driving circuit 50 in the display mode or the sensing mode based on a timing synchronization signal, provide the data control signal to the data driving circuit 50, and provide the gate control signal to the gate driving circuit 70. For example, the sensing mode (or external compensation driving) can be performed for a blank period of a frame set in real time or periodically during a test process before a product of the light emitting display apparatus is launched, during initial driving of the display panel 10, during power on of the light emitting display apparatus, during power off of the light emitting display apparatus, or during power off after long time driving of the display panel 10.

The control circuit 30 stores sensing data per pixel provided from the data driving circuit 50 in a memory circuit in accordance with the sensing mode. The control circuit 30 can compensate for pixel data to be supplied to each of the subpixels 12*a*, 12*b*, 12*c* and 12*d* based on the sensing data stored in the memory circuit during the display mode and provide the compensated data to the data driving circuit 50. For example, the sensing data per pixel can include sequential change information of each of the light emitting device and a driving transistor. Therefore, the control circuit 30 can sense a characteristic value (for example, threshold voltage or mobility) of the driving transistor disposed in each of the subpixels 12*a*, 12*b*, 12*c* and 12*d* in the sensing mode, and can minimize or prevent picture quality deterioration caused by deviation in the characteristic value of the driving transistor in the plurality of subpixels by compensating for the pixel data to be supplied to each of the subpixels 12*a*, 12*b*, 12*c* and 12*d* based on the characteristic value. Since the sensing mode of the light emitting display apparatus is already known in the art by the applicant of the present disclosure, its detailed description will be omitted. For example, the light emitting display apparatus according to the present disclosure can sense the characteristic value of the driving transistor disposed in each of the subpixels 12*a*, 12b, 12c and 12d through the sensing mode disclosed in the Korean Patent Publication No. 10-2016-0093179, 10-2017-0054654, or 10-2018-0002099, and the contents of these publications are incorporated by reference into the present application.

The data driving circuit 50 can individually be connected to each of the m number of data lines DL which are provided in the display panel 10. The data driving circuit 50 can receive a data signal per pixel and a data control signal which are supplied from the control circuit 30 and can receive a plurality of reference gamma voltages which are supplied from a power circuit. The data driving circuit 50 can convert a digital type data signal per pixel to an analog type data voltage per pixel by using the data control signal and the plurality of reference gamma voltages in the display mode, supply the converted data voltage per pixel to the corresponding data line DL, generate a reference voltage synchronized with the data voltage and supply the generated reference voltage to the plurality of reference voltage lines RL.

The data driving circuit 50 can convert a digital type sensing data signal to a sensing data voltage based on the data control signal and the plurality of reference gamma voltages in the sensing mode, supply the converted sensing data voltage to the corresponding subpixels 12a, 12b, 12c and 12d through the corresponding data line DL, sense the characteristic value of the driving transistor disposed in the corresponding subpixels 12a, 12b, 12c and 12d through each of the plurality of reference voltage lines RL, and supply the sensing data per pixel to the control circuit 30. For example, the data driving circuit 50 can sequentially sense the first to fourth subpixels 12a, 12b, 12c and 12d, which constitute the unit pixel 12.

The gate driving circuit 70 can individually be connected to each of the n number of gate lines GL which are provided in the display panel 10. The gate driving circuit 70 can generate gate signals in a predetermined sequence based on the gate control signal which is supplied from the control circuit 30 and supply the generated gate signals to the corresponding gate line GL.

The gate driving circuit 70 according to one embodiment can be integrated in one edge or both edges of the substrate through a manufacturing process of a thin-film transistor and be connected to the plurality of gate lines GL in one-to-one correspondence manner. The gate driving circuit 70 according to another embodiment can be configured as an integrated circuit and mounted at the substrate or a flexible circuit film and connected to the plurality of gate lines GL in one-to-one correspondence manner.

Meanwhile, when the data driving circuit 50 is driven in only the display mode without the sensing mode, the plurality of reference voltage lines RL disposed in the display area AA can be omitted, and the data driving circuit 50 can supply only the data voltage to the corresponding data line DL.

Figure 2:
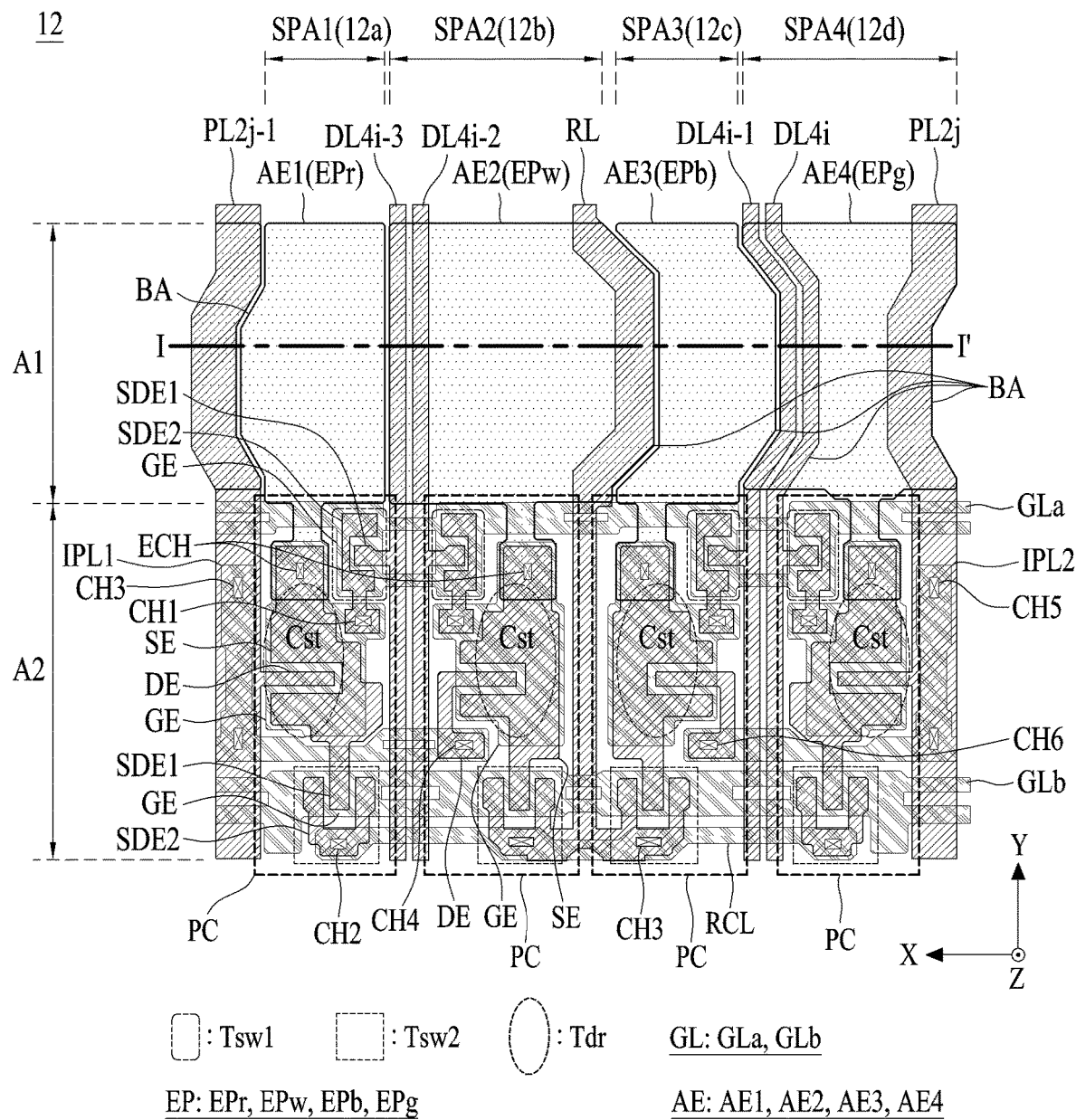
FIG. 2 is a view illustrating an arrangement structure of a unit pixel according to one embodiment shown in FIG. 1.
Figure 3:
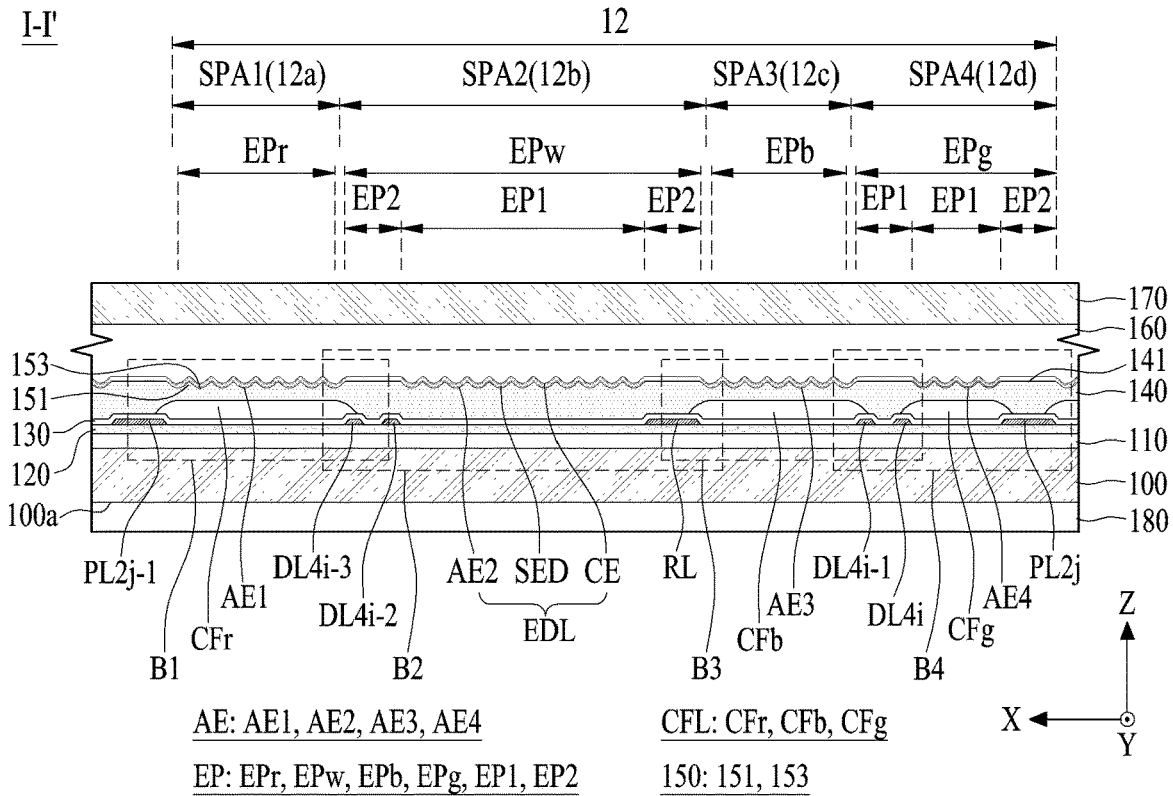
FIG. 3 is a cross-sectional view taken along line I-I' shown in FIG. 2.

FIG. 2 is a view illustrating an arrangement structure of a unit pixel according to one embodiment shown in FIG. 1, and FIG. 3 is a cross-sectional view taken along line I-I' shown in FIG. 2.

Referring to FIGS. 2 and 3, the unit pixel 12 according to one embodiment of the present disclosure can include a plurality of subpixel areas SPA1 to SPA4 disposed along a first direction X and a second direction Y crossing the first direction X, and a plurality of metal lines PL, DL and RL longitudinally extended along the second direction Y and disposed in the plurality of subpixel areas SPA1 to SPA4.

Each of the plurality of subpixel areas SPA1 to SPA4 or the plurality of subpixels 12a, 12b, 12c and 12d can be disposed to overlap all or some of at least one of the plurality of metal lines PL, DL and RL, which is adjacent thereto along the first direction X, or can be disposed among the metal lines PL, DL and RL adjacent to one another. The plurality of subpixel areas SPA1 to SPA4 or the plurality of subpixels 12a, 12b, 12c and 12d can have different sizes to each other. In the following description, the sizes of the subpixel areas SPA1 to SPA4 or the plurality of subpixels 12a, 12b, 12c and 12d can be understood as areas of the subpixel areas SPA1 to SPA4 or the plurality of subpixels 12a, 12b, 12c and 12d. Also, in the following description, the subpixel areas SPA1 to SPA4 can be understood as the subpixels 12a, 12b, 12c and 12d.

Each of the plurality of metal lines PL, DL and RL disposed in the unit pixel 12 can correspond to a pixel driving voltage line PL, a plurality of data lines DL4i-3, DL4i-2, DL4i-1 and DL4i and the reference voltage line RL in one-to-one.

The first subpixel area SPA1 of the plurality of subpixel areas SPA1 to SPA4 can be disposed between the (4i-3)th (i is a natural number) data line DL4i-3 of the plurality of data lines and the (2j-1)th (j is a natural number) pixel driving voltage line PL2j-1 of the plurality of pixel driving voltage lines PL. For example, the (4i-3)th data line DL4i-3 can be a first color data line or a red data line. The (2j-1)th pixel driving voltage line PL2j-1 can be an odd-numbered pixel driving voltage line of the plurality of pixel driving voltage lines PL. For example, based on the first subpixel area SPA1, the (2j-1)th pixel driving voltage line PL2j-1 can be a first metal line, and the (4i-3)th data line DL4i-3 can be a second metal line.

The second subpixel area SPA2 of the plurality of subpixel areas SPA1 to SPA4 can be disposed between the (4i-3)th data line DL4i-3 or the (4i-2)th data line DL4i-2 of the plurality of data lines and the reference voltage line RL. For example, the (4i-2)th data line DL4i-2 can be a second color data line or a white data line. The (4i-3)th data line DL4i-3 and the (4i-2)th data line DL4i-2 can be disposed adjacent to each other and parallel to each other. For example, based on the second subpixel area SPA2, the (4i-3)th data line DL4i-3 and the (4i-2)th data line DL4i-2 can be the first metal lines, and the reference voltage line RL can be the second metal line. And, the (4i-3)th data line DL4i-3 can be a first metal signal line of the first metal line, and the (4i-2)th data line DL4i-2 can be a second metal signal line of the first metal line.

The third subpixel area SPA3 of the plurality of subpixel areas SPA1 to SPA4 can be disposed between the (4i-1)th data line DL4i-1 of the plurality of data lines and the reference voltage line RL. For example, the (4i-1)th data line DL4i-1 can be a third color data line or a blue data line. For example, based on the third subpixel area SPA3, the reference voltage line RL can be the first metal line, and the (4i-1)th data line DL4i-1 can be the second metal line.

The fourth subpixel area SPA4 of the plurality of subpixel areas SPA1 to SPA4 can be disposed between the (4i)th data line DL4i of the plurality of data lines and the (2j)th pixel driving voltage line PL2j of the plurality of pixel driving voltage lines PL. For example, the (4i)th data line DL4i can be a fourth color data line or a green data line. The (2j)th pixel driving voltage line PL2j can be an even-numbered pixel driving voltage line of the plurality of pixel driving voltage lines PL. The (4i-1)th data line DL4i-1 and the (4i)th data line DL4i can be disposed adjacent to each other and parallel to each other. For example, based on the fourth subpixel area SPA4, the (4i-1)th data line DL4i-1 and the (4i)th data line DL4i can be the first metal lines, and the (2j)th pixel driving voltage line PL2j can be the second metal line. And, the (4i-1)th data line DL4i-1 can be a first metal signal line of the first metal line, and the (4i)th data line DL4i can be a second metal signal line of the first metal line.

Each of the plurality of subpixel areas SPA1 to SPA4 can be categorized into a first area A1 and a second area A2 based on the second direction Y.

The first area A1 (or light emitting area) can be disposed at an upper side of the gate line GL based on the second direction Y, and may not be overlapped with the gate line GL. The first areas A1 of the plurality of subpixel areas SPA1 to SPA4 can have different sizes to each other.

The second area A2 (or circuit area) can be disposed at a lower side of the gate line GL based on the second direction Y, and can be overlapped with the gate line GL. The second area A2 of the plurality of subpixel areas SPA1 to SPA4 can substantially have the same size.

Each of the plurality of subpixel areas SPA1 to SPA4 can be disposed in the second area A2 and include a pixel circuit PC which is disposed in the circuit area overlapped with the gate line GL.

The pixel circuit PC of each of the plurality of subpixel areas SPA1 to SPA4 can selectively be connected to the first and second gate lines GLa and GLb of the gate line GL, the pixel driving voltage line PL, four data lines DL4i-3, DL4i-2, DL4i-1 and DL4i, and the reference voltage line RL.

The first gate line GLa can be disposed at one side area most adjacent to the first area A1 in the second area A2 of the plurality of subpixel areas SPA1 to SPA4. The second gate line GLb can be disposed at the other side area spaced apart from the first gate line GLa in the second area A2 of the plurality of subpixel areas SPA1 to SPA4.

The pixel circuit PC according to one embodiment can include a first switching transistor Tsw1, a second switching transistor Tsw2, a driving transistor Tdr, and a storage capacitor Cst. Each of the transistors Tsw1, Tsw2 and Tdr of the pixel circuit PC can be comprised of a thin-film transistor (TFT), and at least one of the thin-film transistors Tsw1, Tsw2 and Tdr can be a-Si TFT, a poly-Si TFT, an Oxide TFT, or an Organic TFT. For example, in the pixel circuit PC, some of the first switching transistor Tsw1, the second switching transistor Tsw2 and the driving transistor Tdr can be a thin-film transistor that includes a semiconductor layer (or active layer) made of low-temperature poly-Si (LTPS) having an excellent response characteristic, and the other of the first switching transistor Tsw1, the second switching transistor Tsw2 and the driving transistor Tdr can be a thin-film transistor that includes a semiconductor layer (or active layer) made of oxide having an excellent off current characteristic.

The first switching transistor Tsw1 can include a gate electrode GE that is connected to the first gate line GLa, a first source/drain electrode SDE1 that is connected to the data line DL adjacent thereto, and a second source/drain electrode SDE2 that is connected to the gate electrode GE of the driving transistor Tdr through a first contact hole CH1. The gate electrode of the first switching transistor Tsw1 can be a protrusion area protruded from one side of the first gate line GLa. The first switching transistor Tsw1 can be turned on in accordance with a first gate signal supplied to the first gate line GLa and supply the data voltage supplied from the data line DL to the gate electrode GE of the driving transistor Tdr.

According to one embodiment, the first source/drain electrode SDE1 of the first switching transistor Tsw1 disposed in the first subpixel area SPA1 can be a protrusion area protruded from one side of the (4i-3)th data line DL4i-3, the first source/drain electrode SDE1 of the first switching transistor Tsw1 disposed in the second subpixel area SPA2 can be a protrusion area protruded from one side of the (4i-2)th data line DL4i-2, the first source/drain electrode SDE1 of the first switching transistor Tsw1 disposed in the third subpixel area SPA3 can be a protrusion area protruded from one side of the (4i-1)th data line DL4i-1, and the first source/drain electrode SDE1 of the first switching transistor Tsw1 disposed in the fourth subpixel area SPA4 can be a protrusion area protruded from one side of the (4i)th data line DL4i.

The second switching transistor Tsw2 can include a gate electrode GE that is connected to the second gate line GLb, a first source/drain electrode SDE1 that is connected to the source electrode of the driving transistor Tdr, and a second source/drain electrode SDE2 that is connected to the reference voltage line RL adjacent thereto. The second switching transistor Tsw2 can supply the reference voltage supplied from the reference voltage line RL to the source electrode SE of the driving transistor Tdr in accordance with a second gate signal supplied to the second gate line GLb in the display mode. The second switching transistor Tsw2 can be turned on in accordance with a second gate signal supplied to the second gate line GLb in the sensing mode and supply a current output from the driving transistor Tdr to the reference voltage line RL or connect the source electrode SE of the driving transistor Tdr to the reference voltage line RL.

In each of the plurality of subpixel areas SPA1 to SPA4, the gate electrode GE of the second switching transistor Tsw2 can be some area of the second gate line GLb or a protrusion area protruded from one side of the second gate line GLb. The first source/drain electrode SDE1 of the second switching transistor Tsw2 can be connected with a reference connection line RCL branched from the reference voltage line RL through a second contact hole CH2. The reference connection line RCL can be disposed to pass through the reference voltage line RL while being parallel with the second gate line GLb and electrically connected with the reference voltage line RL through the second contact hole CH2.

The storage capacitor Cst can be formed between the gate electrode GE and the source electrode SE of the driving transistor Tdr. The storage capacitor Cst according to one embodiment can include a first capacitor electrode provided with the gate electrode GE of the driving transistor Tdr, a second capacitor electrode provided with the source electrode of the driving transistor Tdr, and a dielectric layer formed in an overlap area between the first capacitor electrode and the second capacitor electrode. The storage capacitor Cst can charge (or store) a differential voltage between the gate electrode GE and the source electrode SE of the driving transistor Tdr and turns on the driving transistor Tdr in accordance with the charged voltage.

The driving transistor Tdr can include the gate electrode GE that is connected to the second source/drain electrode SDE2 of the first switching transistor Tsw1, the source electrode SE that is connected to the first source/drain electrode SDE1 of the second switching transistor Tsw2, and the drain electrode DE that is connected to the pixel driving voltage line PL. The driving transistor Tdr is turned on in accordance with the voltage of the storage capacitor Cst and controls the amount of a current flowing from the pixel driving voltage line PL to the light emitting device layer.

The drain electrode DE of the driving transistor Tdr disposed in the first subpixel area SPA1 of the plurality of subpixel areas SPA1 to SPA4 can be embedded in the protrusion area protruded from the (2j-1)th pixel driving voltage line PL2*j*-1, and the drain electrode DE of the driving transistor Tdr disposed in the fourth subpixel area SPA4 of the plurality of subpixel areas SPA1 to SPA4 can be embedded in the protrusion area protruded from the (2j)th pixel driving voltage line PL2*j*.

The drain electrode DE of the driving transistor Tdr disposed in the second subpixel area SPA2 of the plurality of subpixel areas SPA1 to SPA4 can electrically be connected to the (2j-1)th pixel driving voltage line PL2*j*-1 through a first internal power supply line IPL1. For example, the first internal power supply line IPL1 can be disposed on the same layer as the second gate line GLb in parallel with the second gate line GLb, can electrically be connected to the (2j-1)th pixel driving voltage line PL2*j*-1 through at least one third contact hole CH3, and can electrically be connected to the drain electrode DE of the driving transistor Tdr disposed in the second subpixel area SPA2 through a fourth contact hole CH4.

The drain electrode DE of the driving transistor Tdr disposed in the third subpixel area SPA3 of the plurality of subpixel areas SPA1 to SPA4 can electrically be connected to the (2j)th pixel driving voltage line PL2*j* through a second internal power supply line IPL2. For example, the second internal power supply line IPL2 can be disposed on the same layer as the second gate line GLb in parallel with the second gate line GLb, can electrically be connected to the (2j)th pixel driving voltage line PL2*j* through at least one fifth contact hole CH5, and can electrically be connected to the drain electrode DE of the driving transistor Tdr disposed in the third subpixel area SPA3 through a sixth contact hole CH6.

According to one embodiment, each semiconductor layer of the transistors Tsw1, Tsw2 and Tdr of the pixel circuit PC can be disposed on a buffer layer 110 disposed on the substrate 100. The semiconductor layer has a source area, a drain area, and a channel area, and the channel area of the semiconductor layer can be covered (or overlayed) by a gate insulating film. The gate line GL and each of the transistors Tsw1, Tsw2 and Tdr can be disposed on the gate insulating film, and can be covered (or overlayed) by an inter-layer dielectric film 120. The data line DL, the pixel driving voltage line PL, the reference voltage line RL, and the source/drain electrode of the transistors Tsw1, Tsw2 and Tdr can be disposed on the inter-layer dielectric film 120, and can be covered (or overlayed) by a passivation layer 130. The passivation layer 130 can be covered (or overlayed) by an overcoat layer 140 (or planarization layer).

The overcoat layer 140 can be disposed on the entire display area of the substrate 100 to cover (or overlay) the pixel circuit PC. The overcoat layer 140 according to one embodiment can be made of an organic material such as photo acryl, benzocyclobutene, polyimide, and fluorine resin, but is not limited thereto.

According to one embodiment, each semiconductor layer of the transistors Tsw1, Tsw2 and Tdr of the pixel circuit PC can be disposed on a light-shielding layer which is disposed on the substrate 100.

The light-shielding layer can be disposed between the semiconductor layer of each of the transistors Tsw1, Tsw2 and Tdr and the substrate 100 to shield light entering the semiconductor layer through the substrate 100, thereby minimizing or preventing a threshold voltage change of the transistors Tsw1, Tsw2 and Tdr from occurring due to external light. Optionally, the light-shielding layer can electrically be connected to the source electrode of the transistors Tsw1, Tsw2 and Tdr, and therefore can serve as a lower gate electrode of the corresponding transistor. In this case, the threshold voltage change of the transistors Tsw1, Tsw2 and Tdr due to a bias voltage as well as the characteristic change caused by light is minimized or prevented.

Meanwhile, when the pixel circuit PC is operated by only display driving according to the display mode without sensing driving according to the sensing mode, the second switching transistor Tsw2 and the reference voltage line RL are omitted. At this time, the reference voltage line RL shown in FIG. 2 is changed to the pixel driving voltage line PL2*j*. When the second switching transistor Tsw2 is omitted from the pixel circuit PC and the reference voltage line RL is omitted from the unit pixel 12, the arrangement order of the pixel driving voltage line PL and the data line DL, which are disposed in the unit pixel 12, can be changed. For example, in FIG. 2, the (2j-1)th pixel driving voltage line PL2*j*-1 can be changed to the (4i-3)th data line DL4*i*-3. The (4i-3)th data line DL4*i*-3 and the (4i-2)th data line DL4*i*-2 which are adjacent to each other can be changed to the (2j-1)th pixel driving voltage line PL2*j*-1. The reference voltage line RL can be changed to the (4i-2)th data line DL4*i*-2 and the (4i-1)th data line DL4*i*-1 which are adjacent to each other. The (4i-1)th data line DL4*i*-1 and the (4i)th data line DL4*i* which are adjacent to each other can be changed to the (2j)th pixel driving voltage line PL2*j*. And, the 2jth pixel driving voltage line PL2*j* can be changed to the (4i)th data line DL4*i* and the (4i-3)th data line DL4*i*-3 which are adjacent to each other.

Each of the plurality of subpixel areas SPA1 to SPA4 can include a light emission portion EP disposed in the first area A1, and a non-light emission portion disposed in the second area A2 so as to surround the first area A1. In the following description, the light emission portion EP can be understood as an opening portion or an opening area, and the non-light emission portion can be understood as a non-opening portion or a non-opening area.

The light emission portions EP of the plurality of subpixel areas SPA1 to SPA4 can have different sizes to each other for improving luminance and a color temperature of a display image. For example, the light emission portions EP of each of the plurality of subpixel areas SPA1 to SPA4 can be have different sizes to each other based on a color temperature of 6500K or more to be embedded in the light emitting display apparatus or the second subpixel 12*b*.

The light emission portion EP of the first subpixel area SPA1 of the plurality of subpixel areas SPA1 to SPA4 can be a red light emission portion EPr emitting red light or a red opening portion. The light emission portion EP of the second subpixel area SPA2 of the plurality of subpixel areas SPA1 to SPA4 can be a white light emission portion EPw emitting white light or a white opening portion. The light emission portion EP of the third subpixel area SPA3 of the plurality of subpixel areas SPA1 to SPA4 can be a blue light emission portion EPb emitting blue light or a blue opening portion. The light emission portion EP of the fourth subpixel area SPA4 of the plurality of subpixel areas SPA1 to SPA4 can be a green light emission portion EPg emitting green light or a green opening portion. According to one embodiment, the light emission portions EP of the first to fourth subpixel areas SPA1 to SPA4 have sizes (EPw>EPr>EPb>EPg) in the order of the white light emission portion EPw, the red light emission portion EPr, the blue light emission portion EPb and the green light emission portion EPg, but are not limited thereto.

At least one of the light emission portion EP of each of the first to fourth subpixel areas SPA1 to SPA4 according to one embodiment can include at least one bent area BA recessed or protruded along the first direction X.

For example, the red light emission portion EPr can include a bent area BA protruded in a trapezoidal shape toward the (2j-1)th pixel driving voltage line PL2j-1. The white light emission portion EPw can include a bent area BA protruded in a trapezoidal shape toward the reference voltage line RL. The blue light emission portion EPb can include a bent area BA protruded in a trapezoidal shape toward the (4i-1)th data line DL4i-1. The green light emission portion EPg can include a bent area BA recessed in a trapezoidal shape by each bent area BA of the blue light emission portion EPb and the red light emission portion EPr which are adjacent to each other.

Each of the pixel driving voltage line PL, the reference voltage line RL, the (4i-1)th data line DL4i-1 and the (4i)th data line DL4i, which are disposed in the first area A1 of each of the plurality of subpixel areas SPA1 to SPA4, can be bent to correspond to the bent area BA of the light emission portions EP.

The light emission portions EPw and EPg disposed in some subpixel areas SPA2 and SPA4 of the plurality of subpixel areas SPA1 to SPA4 according to one embodiment can be overlapped with at least one of the metal lines PL, DL and RL adjacent along the first direction X.

According to one embodiment, the first metal line and the second metal line of the plurality of metal lines PL, DL and RL can be disposed in some subpixel areas SPA2 and SPA4 to be spaced apart from each other along the first direction X, and the light emission portions EPw and EPg disposed in some subpixel areas SPA2 and SPA4 can be overlapped with at least one of the first metal line and the second metal line. The light emission portions EPw and EPg disposed in some subpixel areas SPA2 and SPA4 of the plurality of subpixel areas SPA1 to SPA4 can include a first light emission portion EP1 disposed between the first metal line and the second metal line, and a second light emission portion EP2 overlapped with at least one of the first metal line and the second metal line. For example, the second light emission portion EP2 can be overlapped with a half or more of at least one of the first metal line and the second metal line based on the first direction X. In this case, when the some subpixel area is the second subpixel area SPA2, the first metal line can be the (4i-3)th data line DL4i-3, and the second metal line can be the reference voltage line RL. Also, when the some subpixel area is the fourth subpixel area SPA4, the first metal line can be the (4i-1)th data line DL4i-1, and the second metal line can be the (2j)th pixel driving voltage line PL2j.

The light emission portions EPr and EPb disposed in the other subpixel areas SPA1 and SPA3 except some subpixel areas SPA2 and SPA4 of the plurality of subpixel areas SPA1 to SPA4 can be not overlapped with two metal lines PL, DL and RL adjacent along the first direction X. The other subpixel areas SPA1 and SPA3 except the some subpixel areas SPA2 and SPA4 of the plurality of subpixel areas SPA1 to SPA4 can include one light emission portion EPr or EPb disposed between two metal lines adjacent along the first direction X. The first subpixel area SPA1 that includes the red light emission portion EPr of the plurality of subpixels areas SPA1 to SPA4 can include a second light emission portion overlapped with at least one of two metal lines PL, DL RL adjacent thereto. In this case, light emitted from the second light emission portion of the red light emission portion EPr can deteriorate a color temperature of white luminance. Therefore, the red light emission portion EPr is embedded so as not to include a second light emission portion overlapped with at least one of the two metal lines PL, DL and RL adjacent thereto.

The light emission portion EP of each of the plurality of subpixel areas SPA1 to SPA4 can include a first side and a second side, which are parallel with the second direction Y.

Based on the first direction X, the first side of the red light emission portion EPr can be spaced apart from a first side (or second side) of the (2j-1)th pixel driving voltage line PL2j-1, and the second side of the red light emission portion EPr can be spaced apart from a first side (or second side) of the (4i-3)th data line DL4i-3.

Based on the first direction X, the first side of the white light emission portion EPw can be aligned in a first side (or second side) of the (4i-3)th data line DL4i-3 adjacent to the red light emission portion EPr within a process error range, and the second side of the white light emission portion EPw can be aligned in a second side (or first side) of the reference line RL adjacent to the white light emission portion EPw within a process error range.

Based on the first direction X, the first side of the blue light emission portion EPb can be spaced apart from a first side (or second side) of the reference line RL, and the second side of the blue light emission portion EPb can be spaced apart from a first side (or second side) of the (4i-1)th data line DL4i-1.

Based on the first direction X, the first side of the green light emission portion EPg can be aligned in a first side (or second side) of the (4i-1)th data line DL4i-1 adjacent to the blue light emission portion EPb within a process error range, and the second side of the green light emission portion EPg can be aligned in a second side (or first side) of the (2j)th pixel driving voltage line PL2j adjacent to the red light emission portion Epr within a process error range.

The light emission portion EP of each of the plurality of subpixel areas SPA1 to SPA4 according to one embodiment can include an uneven pattern portion 150 and a light emitting device layer EDL. The light emission portions EPw and EPg disposed in some subpixel areas SPA2 and SPA4 of the plurality of subpixel areas SPA1 to SPA4 can further include a flat portion (or a flat surface) 141. For example, the light emission portions EPw and EPg disposed in some subpixel areas SPA2 and SPA4 of the plurality of subpixel areas SPA1 to SPA4 according to one embodiment can include an uneven pattern portion 150, a flat portion 141, and a light emitting device layer EDL. The light emission portions EPr and EPb disposed in the other subpixel areas SPA1 and SPA3 except some subpixel areas SPA2 and SPA4 of the plurality of subpixel areas SPA1 to SPA4 can include an uneven pattern portion 150 and a light emitting device layer EDL without including a flat portion 141. In the following description, the flat portion 141 can be understood as a non-pattern portion.

According to one embodiment, each of the first light emission portion EP1 of the red light emission portion EPr, the blue light emission portion EPb and the white light emission portion EPw and the first light emission portion EP1 of the green light emission portion EPg can include an uneven pattern portion 150 disposed in the overcoat layer 140, and each of the second light emission portion EP2 of the white light emission portion EPw and the second light emission portion EP2 of the green light emission portion EPg can include a flat portion 141 disposed in the overcoat layer 140. For example, the overcoat layer 140 disposed on the substrate 100 can include the uneven pattern portion 150 disposed in each of the first light emission portion EP1 of the red light emission portion EPr, the blue light emission portion EPb and the white light emission portion EPw and the first light emission portion EP1 of the green light emission portion EPg, and the flat portion 141 disposed in each of the second light emission portion EP2 of the white light emission portion EPw and the second light emission portion EP2 of the green light emission portion EPg.

The uneven pattern portion 150 can be disposed in the overcoat layer 140 overlapped with each of the first light emission portion EP1 of the red light emission portion EPr, the blue light emission portion EPb and the white light emission portion EPw and the first light emission portion EP1 of the green light emission portion EPg to have a curved (or uneven) shape, whereby a progress path of light emitted from the light emitting device layer EDL is changed to increase light extraction efficiency. Therefore, the uneven pattern portion 150 can be understood as a non-flat portion, a non-planar portion, a fine structure, a light path controller, a microlens portion, a microlens array portion, or a light scattering portion.

The uneven pattern portion 150 according to one embodiment can include a plurality of convex portions 151 spaced apart from each other and a plurality of concave portions 153 disposed between the plurality of convex portions 151.

Each of the plurality of convex portions 151 can be provided in the overcoat layer 140 overlapped with the light emission portion EP to have a shape that can maximize external extraction efficiency of light emitted from a pixel based on an effective light emission area of the light emitting device layer EDL. Each of the plurality of convex portions 151 increases external extraction efficiency of light emitted from the light emitting device layer EDL by changing the progress path of the light emitted from the light emitting device layer EDL toward the substrate 100.

The plurality of convex portions 151 can respectively be connected to each other in all directions. For example, a bottom portion (or base surface) of each of the plurality of convex portions 151 can be connected to bottom portions of the other convex portions 151 adjacent thereto in all directions. Therefore, the overcoat layer 140 overlapped with the light emission portion EP can include a plurality of concave portions 153 formed between the plurality of convex portions 151. One concave portion 153 can be surrounded by the plurality of convex portions 151 adjacent thereto. The plurality of convex portions 151 surrounding one concave portion 153 can be disposed in two-dimensionally hexagonal shape (or honeycomb shape). For example, the plurality of convex portions 151 can be arranged to have a hexagonal shape (or a honeycomb structure).

Figure 4:
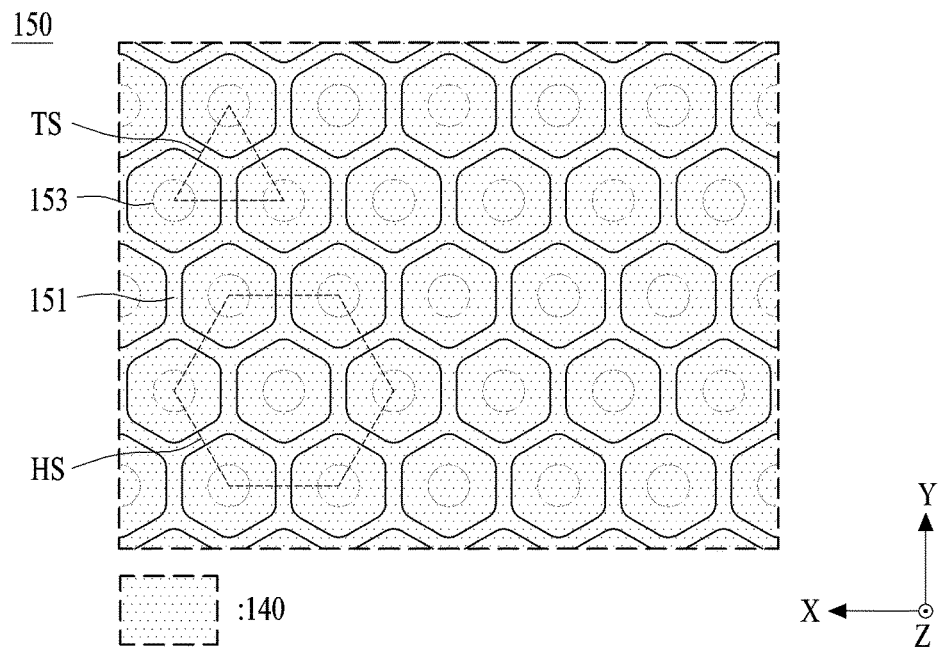
FIG. 4 is a plan view illustrating a planar structure of an uneven pattern portion shown in FIG. 3.

Each of the plurality of concave portions 153 can be disposed to be recessed from an upper surface (or surface) of the overcoat layer 140 corresponding between the plurality of convex portions 151. The plurality of concave portions 153 can respectively be disposed in parallel in a zigzag shape along the second direction Y while being spaced apart from each other along the first direction X. For example, the plurality of concave portions 153 can respectively be disposed in a lattice shape having a constant interval, and the concave portions 153 adjacent to each other can be disposed alternately along the second direction Y. For example, as shown in FIG. 4, three adjacent concave portions 153 can be disposed in two-dimensionally triangular shape, and line segments among centers of three adjacent concave portions 153 can constitute two-dimensionally triangular shape TS. Also, the plurality of concave portions 153 can respectively be surrounded by six concave portions 153 disposed around them. In this case, six concave portions 153 disposed to surround one concave portion 153 can be disposed in two-dimensionally hexagonal shape HS, and line segments among centers of six concave portions 153 disposed to surround one concave portion 153 can constitute two-dimensionally hexagonal shape HS. For example, the plurality of convex portions 151 and the plurality of concave portions 153 can be disposed in two-dimensionally honeycomb shape.

The uneven pattern portion 150 that includes the plurality of convex portions 151 and the plurality of concave portions 153 can be formed through an etching process of the overcoat layer using a mask pattern after the mask pattern is formed on the overcoat layer 140 on the light emission portion EP through a photolithography process using a photoresist. For example, a positive photoresist can be used as the photoresist to improve productivity.

Referring to FIGS. 2 and 3 again, the flat portion 141 disposed in the light emission portions EPr and EPb of the some subpixel areas SPA2 and SPA4 of the plurality of subpixel areas SPA1 to SPA4 can be disposed on the metal line adjacent to the some subpixel areas SPA2 and SPA4. Consequently, the overcoat layer 140 can include a plurality of flat portions 141 disposed on a plurality of metal lines, and an uneven pattern portion 150 disposed between the plurality of flat portions 141.

The light emitting device layer EDL disposed in the light emission portion EP of each of the plurality of subpixel areas SPA1 to SPA4 can include an anode electrode AE, a self-light emitting device SED, and a cathode electrode CE.

The anode electrode AE can be individually disposed on the overcoat layer 140 on the substrate 100 corresponding to the light emission portion EP of each of the plurality of subpixel areas SPA1 to SPA4. According to one embodiment, in the first area A1, the anode electrode AE can have a size and a shape corresponding to the light emission portion EP of each of the plurality of subpixel areas SPA1 to SPA4. The anode electrode AE according to one embodiment can be made of a transparent conductive material such as transparent conductive oxide (TCO) to allow light emitted from the self-light emitting device SED to be transmitted toward the substrate.

The anode electrode AE according to one embodiment can directly be in contact with the uppermost surface of the overcoat layer 140. For example, since the anode electrode AE is directly in contact with each of the uneven pattern portion 150 and the flat portion 141 of the overcoat layer 140, the anode electrode AE can include a shape that follows surface morphology of the flat portion 141 and the uneven pattern portion 150.

The anode electrode AE of each of the plurality of subpixel areas SPA1 to SPA4 according to one embodiment can include an extension portion extended toward the corresponding pixel circuit PC. The extension portion of the anode electrode AE can be electrically connected with the source electrode SE of the driving transistor Tdr of the corresponding pixel circuit PC through an electrode contact hole ECH disposed in the overcoat layer 140 and the passivation layer 130. Therefore, the anode electrode AE of each of the plurality of subpixel areas SPA1 to SPA4 can individually be supplied with a data current from the driving transistor Tdr of the corresponding pixel circuit PC.

The first anode electrode AE1 of the first subpixel area SPA1 of the plurality of subpixel areas SPA1 to SPA4 can have a size smaller than that of the uneven pattern portion 150. For example, in the first area A1 of the first subpixel area SPA1, the size of the red light emission portion EPr can correspond to that of the first anode electrode AE1, whereby the size of the uneven pattern portion 150 can be greater than that of the red light emission portion EPr.

The second anode electrode AE2 disposed in the white light emission portion EPw of the second subpixel area SPA2 of the plurality of subpixel areas SPA1 to SPA4 can have a size wider than that of the uneven pattern portion 150. For example, the second anode electrode AE2 can be disposed on the uneven pattern portion 150 and the flat portion 141. For example, the second anode electrode AE2 can have a structure extended (or enlarged) toward the flat portion 141 on the uneven pattern portion 150. Therefore, in the first area A1 of the second subpixel area SPA2, the size of the white light emission portion EPw can correspond to that of the second anode electrode AE2, whereby the size of the uneven pattern portion 150 can be smaller than that of the white light emission portion EPw.

The third anode electrode AE3 of the third subpixel area SPA3 of the plurality of subpixel areas SPA1 to SPA4 can have a size smaller than that of the uneven pattern portion 150. For example, in the first area A1 of the third subpixel area SPA3, the size of the blue light emission portion EPb can correspond to that of the third anode electrode AE3, whereby the size of the uneven pattern portion 150 can be greater than that of the blue light emission portion EPb.

The fourth anode electrode AE4 disposed in the green light emission portion EPg of the fourth subpixel area SPA4 of the plurality of subpixel areas SPA1 to SPA4 can have a size greater or wider than that of the uneven pattern portion 150. For example, the fourth anode electrode AE4 can be disposed on the uneven pattern portion 150 and the flat portion 141, which are disposed in the green light emission portion EPg. For example, the fourth anode electrode AE4 can have a structure extended (or enlarged) toward the flat portion 141 on the uneven pattern portion 150. Therefore, in the first area A1 of the fourth subpixel area SPA4, the size of the green light emission portion EPg can correspond to that of the fourth anode electrode AE4, whereby the size of the uneven pattern portion 150 can be smaller than that of the green light emission portion EPg.

The self-light emitting device SED of the light emitting device layer EDL can be disposed on the anode electrode AE disposed in each of the first to fourth subpixel areas SPA1 to SPA4. The self-light emitting device SED according to one embodiment can be an organic light emitting device, a quantum dot light emitting device, an inorganic light emitting device, or a micro light emitting device. For example, the self-light emitting device SED made of an organic light emitting device can include a hole function layer disposed on the anode electrode, an organic light emitting layer disposed on the hole function layer, and an electron function layer disposed on the organic light emitting layer.

According to one embodiment, the self-light emitting device SED disposed in each of the first to fourth subpixel areas SPA1 to SPA4 can be disposed to emit light of different colors. For example, the self-light emitting device SED of the first subpixel area SAP1 can include a red organic light emitting layer, the self-light emitting device SED of the third subpixel area SAP3 can include a blue organic light emitting layer, and the self-light emitting device SED of the fourth subpixel area SAP4 can include a green organic light emitting layer. The self-light emitting device SED of the second subpixel area SAP2 can include a plurality of organic light emitting layers for emitting white light.

The self-light emitting device of the second subpixel area SPA2 according to one embodiment can have a stack structure that a first organic light emitting layer and a second organic light emitting layer are deposited. The first organic light emitting layer according to one embodiment emits first light, and can include any one among a blue organic light emitting cell, a green organic light emitting cell, a red organic light emitting cell, a yellow organic light emitting cell, and a yellow-green organic light emitting cell. The second organic light emitting layer can include the other one except an organic light emitting cell of the first organic light emitting layer among a blue organic light emitting cell, a green organic light emitting cell, a red organic light emitting cell, a yellow organic light emitting cell, and a yellow-green organic light emitting cell. Additionally, the self-light emitting device of the second subpixel area SPA2 can further include a third organic light emitting layer that includes the other one except an organic light emitting cell of the first and second organic light emitting layers among a blue organic light emitting cell, a green organic light emitting cell, a red organic light emitting cell, a yellow organic light emitting cell, and a yellow-green organic light emitting cell.

According to another embodiment, the self-light emitting device SED disposed in each of the first to fourth subpixel areas SPA1 to SPA4 can be embedded as a common layer for emitting white light. For example, the self-light emitting device SED disposed in each of the first to fourth subpixel areas SAP1 to SPA4 can include the first organic light emitting layer and the second organic light emitting layer, or can include the first organic light emitting layer, the second organic light emitting layer, and the third organic light emitting layer. In this case, the self-light emitting device SED can directly be in contact with the anode electrode AE disposed in each of the first to fourth subpixel areas SAP1 to SPA4, and can directly be in contact with the flat portion 141 disposed on the overcoat layer 140. For example, in this embodiment, a bank or bank pattern disposed at an edge portion of the anode electrode AE and the flat portion 141 of the overcoat layer 140 can be removed, and the anode electrode AE and the self-light emitting device SED can be extended or enlarged onto the flat portion 141 of the overcoat layer 140, whereby the second light emission portion EP2 can be disposed on the flat portion 141 of the overcoat layer 140.

Additionally, the self-light emitting device SED disposed in each of the first to fourth subpixel areas SPA1 to SPA4 can be changed to the quantum dot light emitting device or can further include a quantum dot light emitting layer to improve a color reproduction rate.

The cathode electrode CE of the light emitting device layer EDL can be disposed on the entire display panel of the substrate 100 to directly contact the self-light emitting device SED. The cathode electrode CE according to one embodiment can include a metal material having high reflectance to reflect light, which is emitted from the self-light emitting device SED and enters there, toward the substrate 100.

The display panel according to one embodiment of the present disclosure can further include an encapsulation layer 160.

The encapsulation layer 160 can be formed on the display area AA of the substrate 100 to cover (or overlay) the cathode electrode CE. The encapsulation layer 160 can serve to protect the thin film transistor and the self-light emitting device SED from external impact and prevent oxygen or/and water and particles from being permeated into the light emitting device layer EDL. The encapsulation layer 160 according to one embodiment can include at least one inorganic film. The encapsulation layer 160 can further include at least one organic film. For example, the encapsulation layer 160 can include a first inorganic encapsulation layer, an organic encapsulation layer, and a second inorganic encapsulation layer.

Optionally, the encapsulation layer 160 can be modified to a filling member surrounding all the pixels. In this case, the light emitting display panel 10 according to the present disclosure further includes an encapsulation substrate 170 attached onto the substrate 100 by using the filling member as a medium. The encapsulation substrate 170 can be made of a plastic material, a glass material, or a metal material. The filling member can include a getter material that absorbs oxygen or/and water.

Additionally, the display panel according to the present disclosure can further include a color filter layer CFL. The color filter layer CFL can be applied when each of the plurality of subpixel areas SPA1 to SPA4 emits white light.

The color filter layer CFL can be disposed to overlap the light emission portions EPr, EPb and EPg of the first, third and fourth subpixel areas SPA1, SPA3 and SPA4 of the plurality of subpixel areas SPA1 to SPA4. The color filter layer CFL can be provided under the anode electrode AE. For example, the color filter layer CFL can be provided between the substrate 100 and the overcoat layer 140. For example, the color filter layer CFL can be interposed between the passivation layer 130 and the overcoat layer 140.

The color filter layer CFL can include a red color filter CFr overlapped with the red light emission portion EPr of the first subpixel area SPA1, a blue color filter CFb overlapped with the blue light emission portion EPb of the third subpixel area SPA3, and a green color filter CFg overlapped with the green light emission portion EPg of the fourth subpixel area SPA4.

Each of the red color filter CFr, the blue color filter CFb and the green color filter CFg can have a size greater or wider than that of the corresponding light emission portions EPr, EPb and EPg. For example, each of the red color filter CFr, the blue color filter CFb and the green color filter CFg can have a size greater or wider than that of the corresponding light emission portions EPr, EPb and EPg to prevent or minimize light leakage in which light leakage components from another adjacent subpixel area are extracted (or outputted) toward the substrate 100.

Each end of the red color filter CFr, the blue color filter CFb and the green color filter CFg can be overlapped with each of the first and second metal lines PL, DL and RL adjacent to each other by interposing the corresponding light emission portions EPr, EPb and EPg. According to one embodiment, each end of the red color filter CFr, the blue color filter CFb and the green color filter CFg can be arranged on their adjacent metal lines PL, DL and RL.

Each end of the red color filter CFr, the blue color filter CFb and the green color filter CFg according to one embodiment can include a quantum dot re-emitting light in accordance with light emitted from the light emitting device layer EDL to the substrate 100 to have a size for emitting light of a color set in the subpixel. In this case, the red color filter CFr may not contain a red quantum dot to reduce light transmittance (or light emission rate) of a long wavelength area, or can further include a long wavelength absorption material (or dye) that absorbs at least a portion of long wavelength light. For example, the long wavelength absorption material can increase a color temperature by absorbing a wavelength of 620 nm to 700 nm and reducing light transmittance (or light emission rate) of the long wavelength area.

Additionally, the light emitting display apparatus according to the present disclosure can further include a polarization film 180 that is attached to a rear surface (or light extraction surface) 100a of the substrate 100. The polarization film 180 changes external light which is reflected by the film transistors and/or the lines which are provided in the display area into a circularly polarized state to improve visibility and a contrast ratio of the light emitting display device. For example, the polarization film 180 can be embedded as a circularly polarization film.

Figure 5:
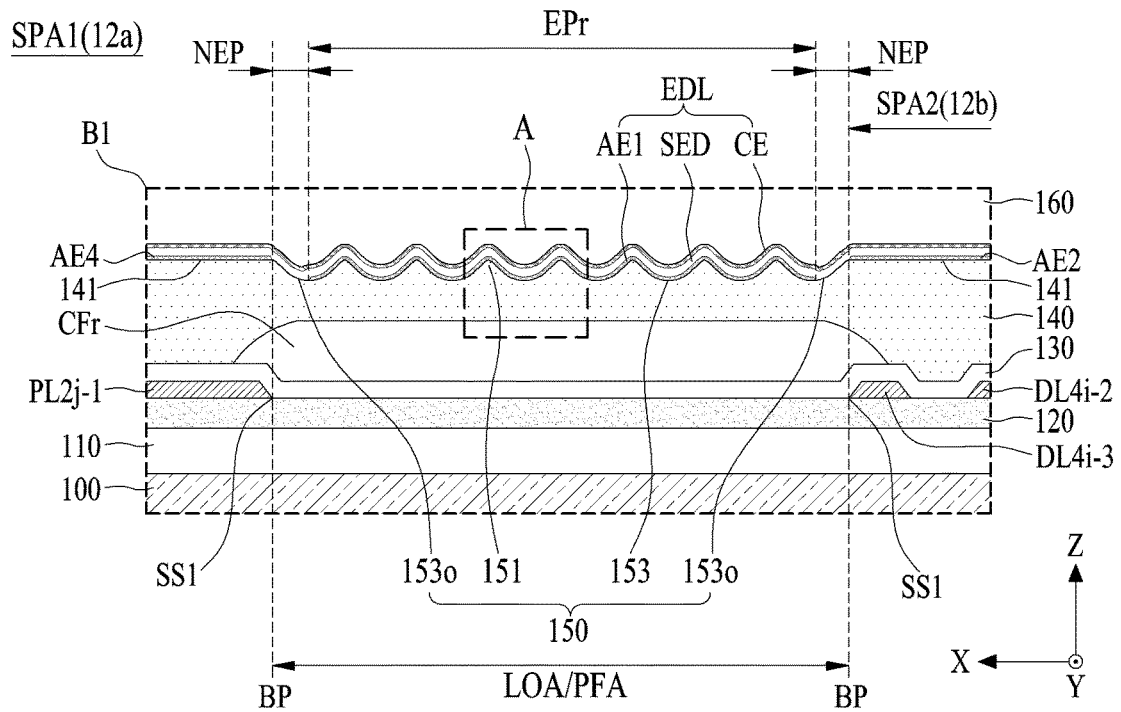
FIG. 5 is an enlarged view illustrating a region 'B1' shown in FIG. 3.
Figure 6:
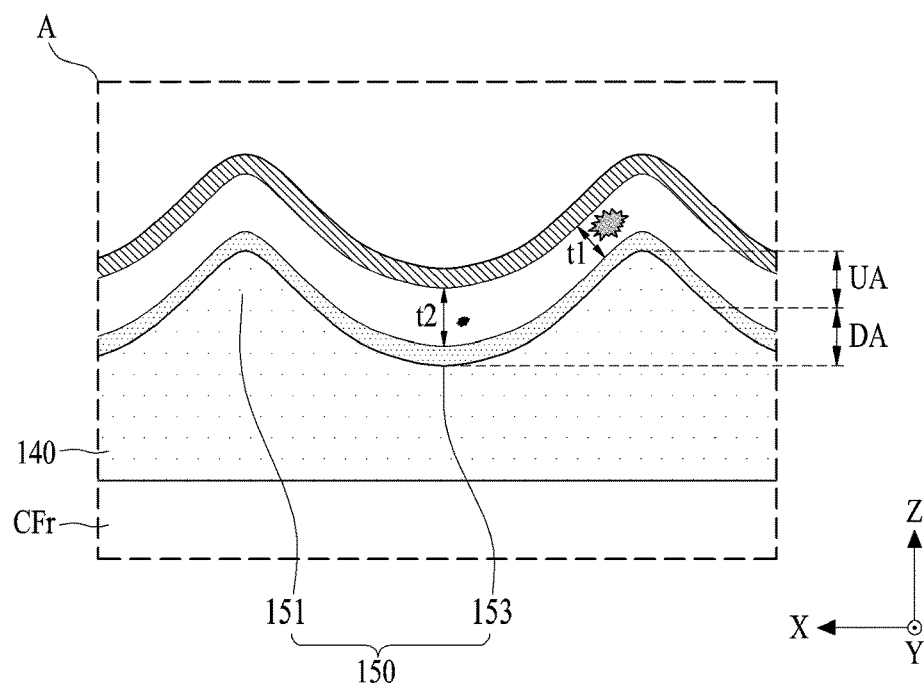
FIG. 6 is an enlarged view illustrating a region 'A' shown in FIG. 5.

FIG. 5 is an enlarged view illustrating a region 'B1' shown in FIG. 3 for illustrating a first subpixel area according to one embodiment of the present disclosure, and FIG. 6 is an enlarged view illustrating a region 'A' shown in FIG. 5.

Referring to FIGS. 2 to 6, the first subpixel area SPA1 according to one embodiment of the present disclosure can include a light output area LOA corresponding between the (2j-1)th pixel driving voltage line PL2j-1 and the (4i-3)th data line DL4i-3, and a pattern formation area PFA corresponding to the uneven pattern portion 150, and a red light emission portion EPr disposed on the uneven pattern portion 150.

The light output area LOA can be disposed between the (2j-1)th pixel driving voltage line PL2j-1 and the (4i-3)th data line DL4i-3 which are disposed in the first area A1 of the first subpixel area SPA1.

The pattern formation area PFA can be defined as an area where the uneven pattern portion 150 of the first area A1 of the first subpixel area SPA1 is disposed. The pattern formation area PFA can substantially have the same size as that of the light output area LOA.

A boundary portion BP between an end of the pattern formation area PFA and the flat portion 141 of the overcoat layer 140 can be arranged or substantially aligned in a first side SS1 of each of the (2j-1)th pixel driving voltage line PL2j-1 and the (4i-3)th data line DL4i-3. Therefore, the size of the uneven pattern portion 150 can substantially be the same as that of the light output area LOA.

The red light emission portion EPr can have a size smaller than that of the uneven pattern portion 150. For example, the red light emission portion EPr can be disposed between the (2j-1)th pixel driving voltage line PL2j-1 (or the first metal line) and the (4i-3)th data line DL4i-3 (or the second metal line).

The red light emission portion EPr according to one embodiment can include a light emitting device layer EDL disposed on the uneven pattern portion 150.

As the light emitting device layer EDL is disposed on the uneven pattern portion 150, the light emitting device layer EDL can have an uneven shaped surface morphology corresponding to that of the uneven pattern portion 150.

The light emitting device layer EDL according to one embodiment can include a first anode electrode AE1, a self-light emitting device SED, and a cathode electrode CE.

The first anode electrode AE1 can be disposed on the uneven pattern portion 150 disposed in the first area A1 of the first subpixel area SPA1. The first anode electrode AE1 can have a size smaller than that of the pattern formation area PFA. For example, the first anode electrode AE1 disposed in the first area A1 of the first subpixel area SPA1 can have a size smaller than that of the uneven pattern portion. An end of the first anode electrode AE1 according to one embodiment can be arranged at the outmost concave portion 153o of the plurality of concave portions 153 included in the uneven pattern portion 150. For example, the end of the first anode electrode AE1 can be arranged on the bottom surface of the outmost concave portion 153o of the plurality of concave portions 153 to be electrically separated (or disconnected) from anode electrodes AE2 and AE4 disposed in adjacent subpixel areas thereto along the first direction X, but is not limited thereto. For example, the end of the first anode electrode AE1 can be arranged on an inclined surface of the outmost concave portion 153o within the range that the first anode electrode AE1 can electrically be separated from the anode electrodes AE2 and AE4.

Based on the first direction X, an area between the anode electrodes AE2 and AE4 disposed in the adjacent subpixel area and the end of the first anode electrode AE1 can be defined as a non-light emitting portion NEP.

Since the first anode electrode AE1 is directly in contact with the uneven pattern portion 150, the first anode electrode AE1 can include a shape that follows a surface morphology of the uneven pattern portion 150. For example, since the first anode electrode AE1 is formed (or deposited) on the uneven pattern portion 150 of the overcoat layer 140 to have a relatively thin thickness, it can have a surface morphology that follows the surface morphology of the uneven pattern portion 150. Therefore, the first anode electrode AE1 can be disposed in a conformal morphology, which follows a surface morphology of the uneven pattern portion 150, by a deposition process of a transparent conductive material.

The self-light emitting device SED can be formed on the first anode electrode AE1 and therefore can directly be in contact with the first anode electrode AE1. The self-light emitting device SED according to one embodiment can be formed (or deposited) to have a thickness relatively thicker than that of the first anode electrode AE1, whereby the self-light emitting device SED can have a surface morphology different from that of the first anode electrode AE1. The self-light emitting device SED can directly be in contact with the overcoat layer 140 in the area where the first anode electrode AE1 is not disposed in the pattern formation area PFA, whereby the edge portion of the uneven pattern portion 150 in the first area A1 of the first subpixel area SPA1 can be the non-light emitting portion NEP.

The self-light emitting device SED according to one embodiment can have a first thickness t1 in an upper area UA that includes a peak portion of the convex portion 151 of the uneven pattern portion 150, and can have a second thickness t2 thicker than the first thickness t1 in a downward area (or a lower area) DA that includes a bottom portion of the concave portion 153. Therefore, the self-light emitting device SED can have an effective light emission area and a non-effective light emission area in accordance with the thicknesses t1 and t2. The effective light emission area of the self-light emitting device SED is an area where relatively strong light emission occurs, and can be set to the upper area UA of the convex portions 151, and the non-effective light emission area of the self-light emitting device SED is an area where relatively weak light emission occurs, and can be set to the downward area DA of the convex portions 151. Therefore, a diameter and a height of the convex portion 151 can be embedded such that light emission does not occur in the downward area DA of the convex portions 151 and light emission occurs in only the upper area UA of the convex portions 151, based on power consumption and light emission efficiency.

The cathode electrode CE can be formed on the self-light emitting device SED and therefore can directly be in contact with the self-light emitting device SED. The cathode electrode CE according to one embodiment can be formed (or deposited) on the self-light emitting device SED to have a thickness relatively thicker than that of the self-light emitting device SED. Therefore, the cathode electrode CE can be embedded in a conformal shape that follows a surface morphology of the self-light emitting device SED as it is.

As the first subpixel area SPA1 or the first subpixel 12a can include the red light emission portion EPr of a size smaller than the uneven pattern portion 150, contribution of red light to white light can be reduced to increase a color temperature of white light.

Figure 7:
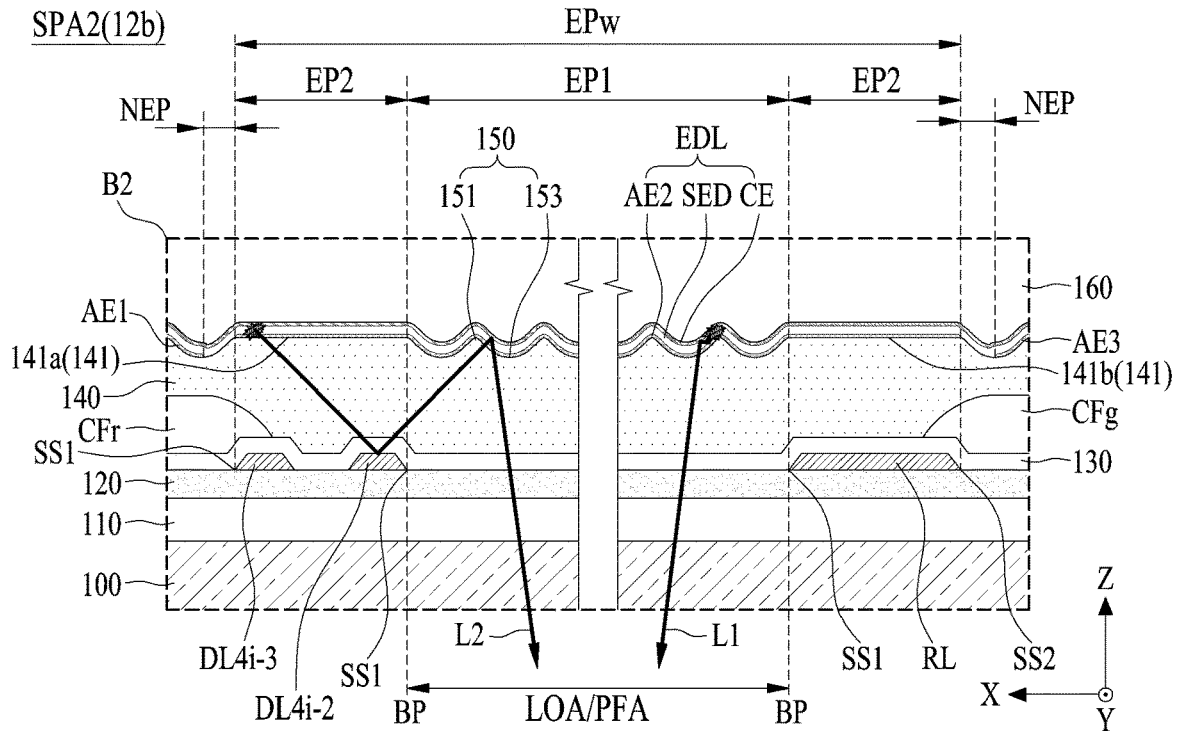
FIG. 7 is an enlarged view of a region 'B2' shown in FIG. 3.

FIG. 7 is an enlarged view of a region 'B2' shown in FIG. 3 for illustrating a second subpixel area according to one embodiment of the present disclosure.

Referring to FIGS. 2, 3 and 7, the second subpixel area SPA2 according to one embodiment of the present disclosure can include a light output area LOA corresponding between the (4i-2)th data line DL4i-2 and the reference voltage line RL, a pattern formation area PFA corresponding to the uneven pattern portion 150, a flat portion 141 disposed on each of the (4i-2)th data line DL4i-2 and the reference voltage line RL, and a white light emission portion EPw disposed on the uneven pattern portion 150 and the flat portion 141.

The light output area LOA can be disposed between the (4i-2)th data line DL4i-2 and the reference voltage line RL which are disposed in the first area A1 of the second subpixel area SPA2.

The pattern formation area PFA can be defined as an area where the uneven pattern portion 150 of the first area A1 of the second subpixel area SPA2 is disposed. The pattern formation area PFA can substantially have the same size as that of the light output area LOA.

A boundary portion BP between an end of the pattern formation area PFA and the flat portion 141 of the overcoat layer 140 can be arranged or substantially aligned in a first side SS1 of each of the (4i-2)th data line DL4i-2 and the reference voltage line RL. Therefore, the size of the uneven pattern portion 150 can substantially be the same as that of the light output area LOA.

The white light emission portion EPw can have a size greater than that of the uneven pattern portion 150. For example, the white light emission portion EPw can be disposed between the (4i-3)th data line DL4i-3 (or the first metal line) and the reference voltage line RL (or the second metal line). For example, the white light emission portion EPw can be disposed on the flat portion 141 and the uneven pattern portion 150, which are disposed on the overcoat layer 140 covering (or overlaying) each of the (4i-3)th data line DL4i-3, the (4i-2)th data line DL4i-2 and the reference voltage line RL. For this reason, the white light emission portion EPw can have a size greater than that of the uneven pattern portion 150 as much as the size of the flat portion 141.

The flat portion 141 of the overcoat layer 140 disposed in the second subpixel area SPA2 can include a first flat portion 141a disposed on the (4i-3)th data line DL4i-3 and the (4i-2)th data line DL4i-2, and a second flat portion 141b disposed on the reference voltage line RL.

The white light emission portion EPw according to one embodiment can include a first light emission portion EP1 disposed on the uneven pattern portion 150, and a second light emission portion EP2 disposed on the flat portion 141.

As the first light emission portion EP1 is disposed on the uneven pattern portion 150, the first light emission portion EP1 can have a surface morphology corresponding to that of the uneven pattern portion 150. As the second light emission portion EP2 is disposed on the flat portion 141, the second light emission portion EP2 can have a surface morphology corresponding to that of the flat portion 141.

The white light emission portion EPw according to one embodiment can include a light emitting device layer EDL disposed on the uneven pattern portion 150 and the flat portion 141 which are disposed at the overcoat layer 140.

As the light emitting device layer EDL is disposed on the uneven pattern portion 150 and the flat portion 141, the light emitting device layer EDL can have a surface morphology that includes an uneven shape and a flat shape corresponding to the surface morphology of the uneven pattern portion 150 and the flat portion 141.

The light emitting device layer EDL according to one embodiment can include a second anode electrode AE2, a self-light emitting device SED, and a cathode electrode CE.

The second anode electrode AE2 can be disposed on the overcoat layer 140 corresponding to the first light emission portion EP1 and the second light emission portion EP2 of the second subpixel area SPA2. The second anode electrode AE2 can be disposed on the uneven pattern portion 150 and the flat portion 141 which are disposed in the first area A1 of the second subpixel area SPA2. The second anode electrode AE2 can have a size greater than that of the pattern formation area PFA. For example, the second anode electrode AE2 can be disposed to cover (or overlay) the entire uneven pattern portion 150 and the flat portion 141, whereby the second anode electrode AE2 can have a size greater than that of the uneven pattern portion 150 as much as the size of the flat portion 141.

An end of the second anode electrode AE2 according to one embodiment can be arranged in the flat portion 141 connected to the uneven pattern portion 150 of each of the first and third subpixel areas SPA1 and SPA3 adjacent thereto in the first direction X.

A first end of the second anode electrode AE2 disposed on the first flat portion 141a of the flat portion 141 can be arranged or substantially aligned in the first side SS1 of the (4i-3)th data line DL4i-3. In other words, the first end of the second anode electrode AE2 can be aligned at the end of the first flat portion 141a connected to the uneven pattern portion 150 of the first subpixel area SPA1 adjacent thereto in the first direction X. Therefore, the second anode electrode AE2 can electrically be separated (or disconnected) from the first anode electrode AE1 disposed in the first subpixel area SPA1.

A second end of the second anode electrode AE2 disposed on the second flat portion 141b of the flat portion 141 can be arranged or substantially aligned in a second side SS2 of the reference voltage line RL adjacent to the third subpixel area SPA3. In other words, the second end of the second anode electrode AE2 can be aligned at the end of the second flat portion 141b connected to the uneven pattern portion 150 of the third subpixel area SPA3 adjacent thereto in the first direction X. Therefore, the second anode electrode AE2 can electrically be separated (or disconnected) from the third anode electrode AE3 disposed in the third subpixel area SPA3.

In FIG. 7, the first end of the second anode electrode AE2 is arranged in the first side SS1 of the (4i-3)th data line DL4i-3, but is not limited thereto. For example, the first end of the second anode electrode AE2 can be arranged on the (4i-2)th data line DL4i-2.

Since the second anode electrode AE2 is directly in contact with each of the uneven pattern portion 150 and the flat portion 141, the second anode electrode AE2 can include a shape that follows a surface morphology of each of the uneven pattern portion 150 and the flat portion 141. Since the second anode electrode AE2 is substantially the same as the first anode electrode AE1 except that the second anode electrode AE2 is disposed on the uneven pattern portion 150 and the flat portion 141 of the white light emission portion EPw, and their repetitive descriptions are omitted or will be briefly described below.

The self-light emitting device SED can be formed on the second anode electrode AE2 and therefore can directly be in contact with the second anode electrode AE2. The self-light emitting device SED according to one embodiment can be formed (or deposited) to have a thickness relatively thicker than that of the second anode electrode AE2, whereby the self-light emitting device SED can have a surface morphology different from that of the second anode electrode AE2.

The cathode electrode CE can be formed on the self-light emitting device SED and therefore can directly be in contact with the self-light emitting device SED. The cathode electrode CE according to one embodiment can be formed (or deposited) on the self-light emitting device SED to have a thickness relatively thinner than that of the self-light emitting device SED. Therefore, the cathode electrode CE can be disposed in a conformal shape that follows a surface morphology of the self-light emitting device SED as it is.

As the second subpixel area SPA2 or the second subpixel 12b can include the first light emission portion EP1 disposed on the uneven pattern portion 150 of the overcoat layer 140 and the second light emission portion EP2 disposed on the flat portion 141 of the overcoat layer 140, a color temperature of white light can be increased by light L2 generated from the second light emission portion EP2, and blue efficiency of the light emitting display apparatus can be increased.

For example, the first light L1 generated from the light emitting device layer EDL of the first light emission portion EP1 can be reflected by the uneven pattern portion 150 and then extracted (or outputted) toward the substrate 100. The second light L2 generated from the light emitting device layer EDL of the second light emission portion EP2 can be reflected by the data lines DL4i-3 and DL4i-2 and/or the reference voltage line RL and then move to the uneven pattern portion 150. Then, the second light L2 can be again reflected by the uneven pattern portion 150 and then extracted (or outputted) toward the substrate 100. At this time, the light emitting device layer EDL disposed in the second light emission portion EP2 in a flat structure can emit the second light L2 of cool white, of which blue peak wavelength has a relatively high color temperature. Therefore, the white light emission portion EPw can emit white light (L1+L2), in which the first light L1 according to a light emission spectrum of the first light emission portion EP1 and the second light L2 according to a light emission spectrum of the second light emission portion EP2 are mixed with each other, toward the substrate 100. For this reason, light extraction efficiency and color temperature of the white light can be increased.

According to a comparison example, when the first light emission portion EP1 disposed in the white light emission portion EPw has the same flat structure as that of the second light emission portion EP2 without having an uneven structure, the light L2 generated from the second light emission portion EP2 can be reflected toward the light output area LOA and repeatedly subjected to total reflection due to its great progress angle, whereby the light L2 can be trapped in the second light emission portion EP2 without being emitted toward the substrate 100. For this reason, in the comparison example, current loss can occur due to light emission of the second light emission portion EP2 that generates the second light L2 which is not emitted toward the substrate 100. On the other hand, according to the embodiment of the present disclosure, the second light L2 generated from the second light emission portion EP2, progressing at a total reflection angle can be emitted toward the substrate 100 by the uneven pattern portion 150 disposed in the first light emission portion EP1, whereby current loss can be prevented or minimized.

Figure 8:
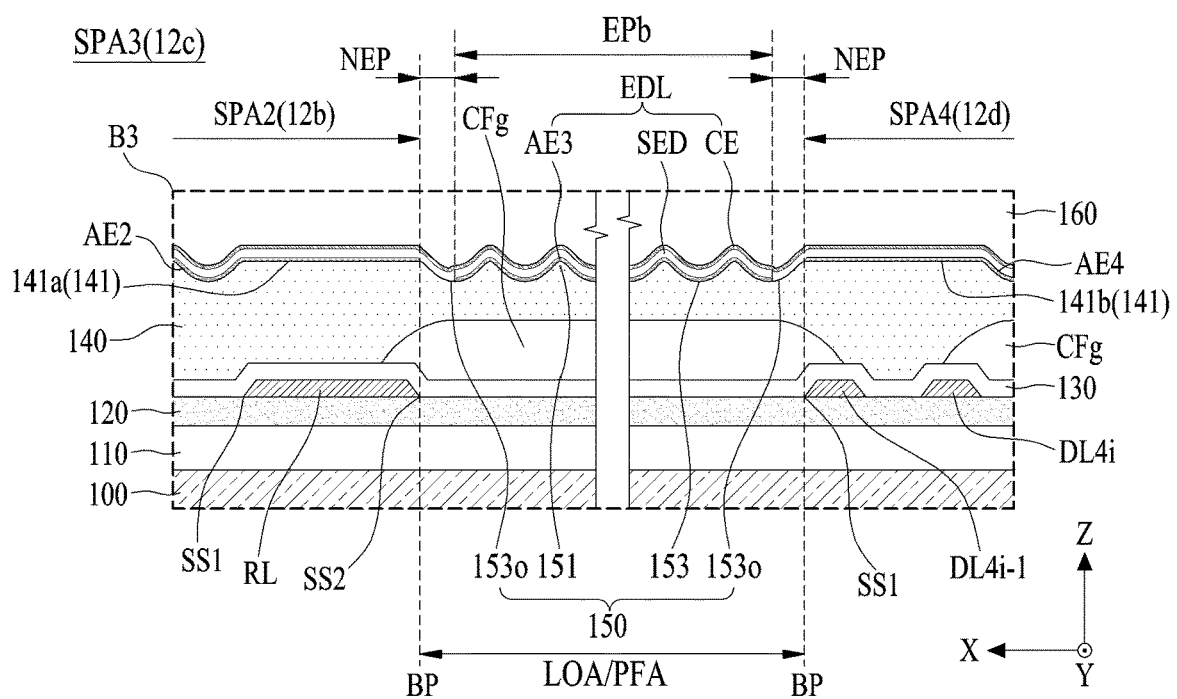
FIG. 8 is an enlarged view of a region 'B3' shown in FIG. 3.

FIG. 8 is an enlarged view of a region 'B3' shown in FIG. 3 for illustrating a third subpixel area according to one embodiment of the present disclosure.

Referring to FIGS. 2, 3 and 8, the third subpixel area SPA3 according to one embodiment of the present disclosure can include a light output area LOA corresponding between the reference voltage line RL and the (4i-1)th data line DL4i-1, a pattern formation area PFA corresponding to the uneven pattern portion 150, and a blue light emission portion EPb disposed on the uneven pattern portion 150.

The light output area LOA can be disposed between the reference voltage line RL and the (4i-1)th data line DL4i-1 which are disposed in the first area A1 of the third subpixel area SPA3. A size of the light output area LOA can be set based on color temperature increase of white light emitted from the second subpixel area SPA2.

The pattern formation area PFA can be defined as an area where the uneven pattern portion 150 of the first area A1 of the third subpixel area SPA3 is disposed. The pattern formation area PFA can substantially have the same size as that of the light output area LOA.

A boundary portion BP between an end of the pattern formation area PFA and the flat portion 141 of the overcoat layer 140 can be arranged or substantially aligned in each of a second side SS2 of the reference voltage line RL and a first side SS1 of the (4i-1)th data line DL4i-1. Therefore, the size of the uneven pattern portion 150 can substantially be the same as that of the light output area LOA.

The blue light emission portion EPb can have a size smaller than that of the uneven pattern portion 150. For example, the blue light emission portion EPb can be disposed between the reference voltage line RL (or the first meal line) and the (4i-1)th data line DL4i-1 (or the second metal line).

The blue light emission portion EPb according to one embodiment of the present disclosure can include a light emitting device layer EDL disposed on the uneven pattern portion 150.

As the light emitting device layer EDL is disposed on the uneven pattern portion 150, the light emitting device layer EDL can have a surface morphology corresponding to that of the uneven pattern portion 150.

The light emitting device layer EDL according to one embodiment can include a third anode electrode AE3, a self-light emitting device SED, and a cathode electrode CE.

The third anode electrode AE3 can be disposed on the uneven pattern portion 150 disposed in the first area A1 of the third subpixel area SPA3. The third anode electrode AE3 can have a size smaller than that of the pattern formation area PFA. For example, the third anode electrode AE3 disposed in the first area A1 of the third subpixel area SPA3 can have a size smaller than that of the uneven pattern portion 150. An end of the third anode electrode AE3 according to one embodiment can be arranged in the outmost concave portion 153o of the plurality of concave portions 153 included in the uneven pattern portion 150. For example, the end of the third anode electrode AE3 can be arranged on the bottom surface of the outmost concave portion 153o of the plurality of concave portions 153 to be electrically separated (or disconnected) from anode electrodes AE2 and AE4 disposed in the adjacent subpixel areas thereto along the first direction X, but is not limited thereto. The end of the third anode electrode AE3 can be arranged on an inclined surface of the outmost concave portion 153o within the range that the third anode electrode AE3 can electrically be separated (or disconnected) from the anode electrodes AE2 and AE4.

Based on the first direction X, an area between the anode electrodes AE2 and AE4 disposed in the adjacent subpixel area and the end of the third anode electrode AE3 can be defined as a non-light emitting portion NEP.

Since the third anode electrode AE3 is directly in contact with the uneven pattern portion 150, the third anode electrode AE3 can include a shape that follows a surface morphology of the uneven pattern portion 150. Since the third anode electrode AE3 is substantially the same as the first anode electrode AE1 except that the third anode electrode AE3 is disposed on the uneven pattern portion 150 of the red light emission portion EPr, and their repetitive descriptions are omitted or will be briefly described below.

The self-light emitting device SED can be formed on the third anode electrode AE3 and therefore can directly be in contact with the third anode electrode AE3. The cathode electrode CE can be formed on the self-light emitting device SED and therefore can directly be in contact with the self-light emitting device SED. Since the self-light emitting device SED and the cathode electrode CE which are disposed in the red light emission portion EPr are substantially the same as the self-light emitting device SED and the cathode electrode CE of the red light emission portion EPr disposed in the first subpixel area SPA1, and their repetitive descriptions are omitted or will be briefly described below.

The third subpixel area SPA3 or the third subpixel 12c can include a blue light emission portion EPb of a size smaller than that of the uneven pattern portion 150 based on a color temperature increase of white light emitted from the second subpixel area SPA2, whereby lifetime of the third subpixel area SPA3 or the third subpixel 12c can be extended.

Figure 9:
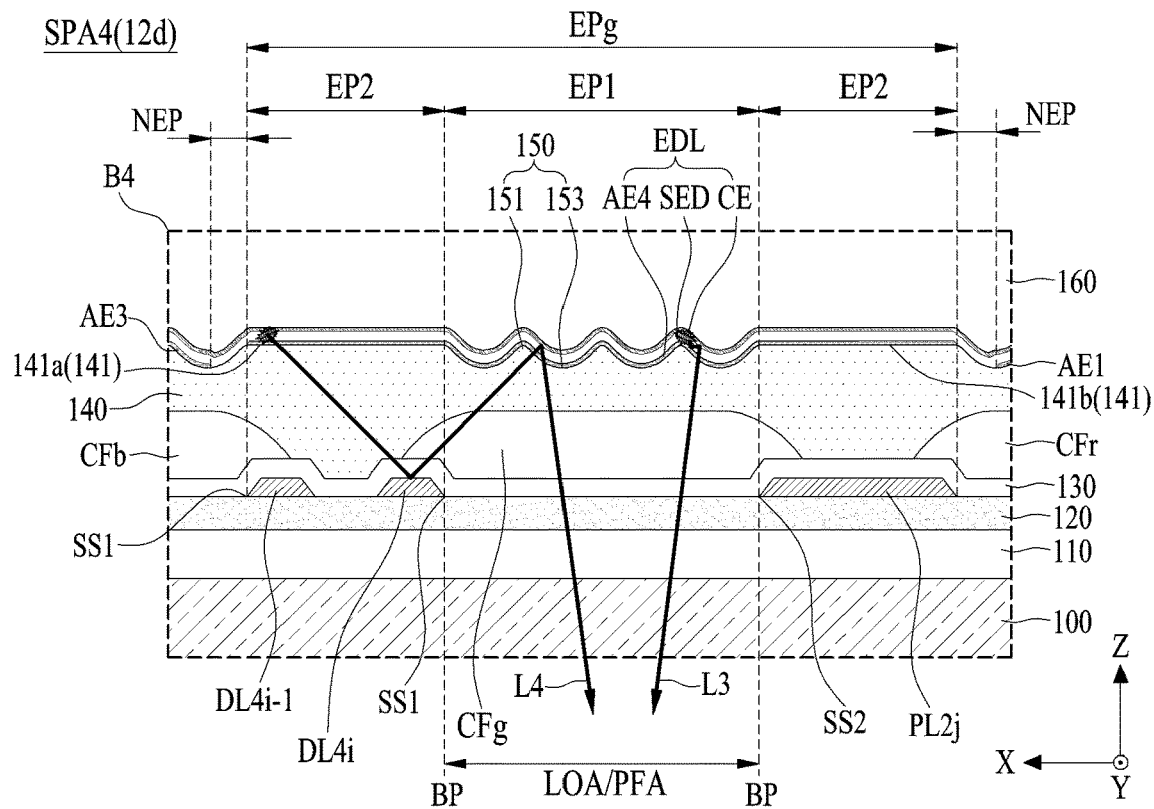
FIG. 9 is an enlarged view of a region 'B4' shown in FIG. 3.

FIG. 9 is an enlarged view of a region 'B4' shown in FIG. 3 for illustrating a fourth subpixel area according to one embodiment of the present disclosure.

Referring to FIGS. 2, 3 and 9, the fourth subpixel area SPA4 according to one embodiment of the present disclosure can include a light output area LOA corresponding between the (4i)th data line DL4i and the (2j)th pixel driving voltage line PL2j, a pattern formation area PFA corresponding to the uneven pattern portion 150, a flat portion 141 disposed on each of the (4i-1)th data line DL4i-1 and the (2j)th pixel driving voltage line PL2j, and a green light emission portion EPg disposed on the uneven pattern portion 150 and the flat portion 141.

The light output area LOA can be disposed between the (4i)th data line DL4i and the (2j)th pixel driving voltage line PL2j which are disposed in the first area A1 of the fourth subpixel area SPA4.

The pattern formation area PFA can be defined as an area where the uneven pattern portion 150 of the first area A1 of the fourth subpixel area SPA4 is disposed. The pattern formation area PFA can substantially have the same size as that of the light output area LOA.

A boundary portion BP between an end of the pattern formation area PFA and the flat portion 141 of the overcoat layer 140 can be arranged or substantially aligned in a first side SS1 of the (4i)th data line DL4i and a second side SS2 of the (2j)th pixel driving voltage line PL2j. Therefore, the size of the uneven pattern portion 150 can substantially be the same as that of the light output area LOA.

The green light emission portion EPg can have a size greater than that of the uneven pattern portion 150. For example, the green light emission portion EPg can be disposed between the (4i-1)th data line DL4*i*-1 (or the first metal line) and the (2j)th pixel driving voltage line PL2*j* (or the second metal line). For example, the green light emission portion EPg can be disposed on the flat portion 141 and the uneven pattern portion 150, which are disposed on the overcoat layer 140 covering (or overlaying) each of the (4i-1)th data line DL4*i*-1, the (4i)th data line DL4*i* and the (2j)th pixel driving voltage line PL2*j*. For this reason, the green light emission portion EPg can have a size greater than that of the uneven pattern portion 150 as much as the size of the flat portion 141.

The flat portion 141 of the overcoat layer 140 disposed in the fourth subpixel area SPA4 can include a first flat portion 141*a* disposed on the (4i-1)th data line DL4*i*-1 and the (4i)th data line DL4*i*, and a second flat portion 141*b* disposed on the (2j)th pixel driving voltage line PL2*j*.

The green light emission portion EPg according to one embodiment can include a first light emission portion EP1 disposed on the uneven pattern portion 150, and a second light emission portion EP2 disposed on the flat portion 141.

As the first light emission portion EP1 is disposed on the uneven pattern portion 150, the first light emission portion EP1 can have a surface morphology corresponding to that of the uneven pattern portion 150. As the second light emission portion EP2 is disposed on the flat portion 141, the second light emission portion EP2 can have a surface morphology corresponding to that of the flat portion 141.

The green light emission portion EPg according to one embodiment can include a light emitting device layer EDL disposed on the uneven pattern portion 150 and the flat portion 141 which are disposed on the overcoat layer 140.

As the light emitting device layer EDL is disposed on the uneven pattern portion 150 and the flat portion 141, the light emitting device layer EDL can have a surface morphology that includes an uneven shape and a flat shape corresponding to the surface morphology of the uneven pattern portion 150 and the flat portion 141.

The light emitting device layer EDL according to one embodiment can include a fourth anode electrode AE4, a self-light emitting device SED, and a cathode electrode CE.

The fourth anode electrode AE4 can be disposed on the overcoat layer 140 of the first light emission portion EP1 and the second light emission portion EP2 of the fourth subpixel area SPA4. The fourth anode electrode AE4 can be disposed on the uneven pattern portion 150 and the flat portion 141 which are disposed in the first area A1 of the fourth subpixel area SPA4. The fourth anode electrode AE4 can have a size greater than that of the pattern formation area PFA. For example, the fourth anode electrode AE4 can be disposed to cover (or overlay) the entire uneven pattern portion 150 and the flat portion 141, whereby the fourth anode electrode AE4 can have a size greater than that of the uneven pattern portion 150 as much as the size of the flat portion 141.

An end of the fourth anode electrode AE4 according to one embodiment can be arranged in the flat portion 141 connected to the uneven pattern portion 150 of each of the first and third subpixel areas SPA1 and SPA3 adjacent in the first direction X.

A first end of the fourth anode electrode AE4 disposed on the first flat portion 141*a* of the flat portion 141 can be arranged or substantially aligned in the first side SS1 of the (4i-1)th data line DL4*i*-1. In other words, the first end of the fourth anode electrode AE4 can be aligned at the end of the first flat portion 141*a* connected to the uneven pattern portion 150 of the third subpixel area SPA3 adjacent in the first direction X. Therefore, the fourth anode electrode AE4 can electrically be separated (or disconnected) from the third anode electrode AE3 disposed in the third subpixel area SPA3.

A second end of the fourth anode electrode AE4 disposed on the second flat portion 141*b* of the flat portion 141 can be arranged or substantially aligned in a second side SS2 of the (2j)th pixel driving voltage line PL2*j* adjacent thereto. In other words, the second end of the fourth anode electrode AE4 can be aligned at the end of the second flat portion 141*b* connected to the uneven pattern portion 150 of the first subpixel area SPA1 adjacent in the first direction X. Therefore, the fourth anode electrode AE4 can electrically be separated (or disconnected) from the first anode electrode AE1 disposed in the first subpixel area SPA1 of next unit pixel.

In FIG. 9, the first end of the fourth anode electrode AE4 is arranged in the first side SS1 of the (4i-1)th data line DL4*i*-1, but is not limited thereto. For example, the first end of the fourth anode electrode AE4 can be arranged on the (4i)th data line DL4*i*.

Since the fourth anode electrode AE4 is directly in contact with each of the uneven pattern portion 150 and the flat portion 141, the fourth anode electrode AE4 can include a shape that follows a surface morphology of each of the uneven pattern portion 150 and the flat portion 141. Since the fourth anode electrode AE4 is substantially the same as the first anode electrode AE1 except that the fourth anode electrode AE4 is disposed on the uneven pattern portion 150 and the flat portion 141 of the green light emission portion EPg, and their repetitive descriptions are omitted or will be briefly described below.

The self-light emitting device SED can be formed on the fourth anode electrode AE4 and therefore can directly be in contact with the fourth anode electrode AE4. The cathode electrode CE can be formed on the self-light emitting device SED and therefore can directly be in contact with the self-light emitting device SED. Since the self-light emitting device SED and the cathode electrode CE which are disposed in the green light emission portion EPg are substantially the same as the self-light emitting device SED and the cathode electrode CE of the white light emission portion EPw disposed in the second subpixel area SPA2, and their repetitive descriptions are omitted or will be briefly described below.

As the fourth subpixel area SPA4 or the fourth subpixel 12*d* can include the first light emission portion EP1 disposed on the uneven pattern portion 150 of the overcoat layer 140 and the second light emission portion EP2 disposed on the flat portion 141 of the overcoat layer 140, light extraction efficiency of green light can be increased by light L4 generated from the second light emission portion EP2.

For example, the third light L3 generated from the light emitting device layer EDL of the first light emission portion EP1 can be reflected by the uneven pattern portion 150 and then extracted (or outputted) toward the substrate 100. The fourth light L4 generated from the light emitting device layer EDL of the second light emission portion EP2 can be reflected by the data lines DL4*i*-1 and DL4*i* and/or the (2j)th pixel driving voltage line PL2*j* and then move to the uneven pattern portion 150. Then, the fourth light L4 can be again reflected by the uneven pattern portion 150, filtered by the green color filter CFg and then extracted (or outputted) toward the substrate 100. Therefore, the green light emission portion EPg can emit green light, in which the third light L3 according to a light emission spectrum of the first light emission portion EP1 and the fourth light L4 according to a light emission spectrum of the second emission portion EP2 are mixed with each other, toward the substrate 100. For this reason, light extraction efficiency of the green light can be increased and luminance of the unit pixel 12 can be increased. For example, since the green light emitted from the green light emission portion EPg of the fourth subpixel area SPA4 contributes to increase of white luminance embodied in the unit pixel 12, in this embodiment, light extraction efficiency of the green light emission portion EPg can be increased through the second light emission portion EP2, whereby white luminance embodied in the unit pixel 12 can be enhanced.

Figure 10:
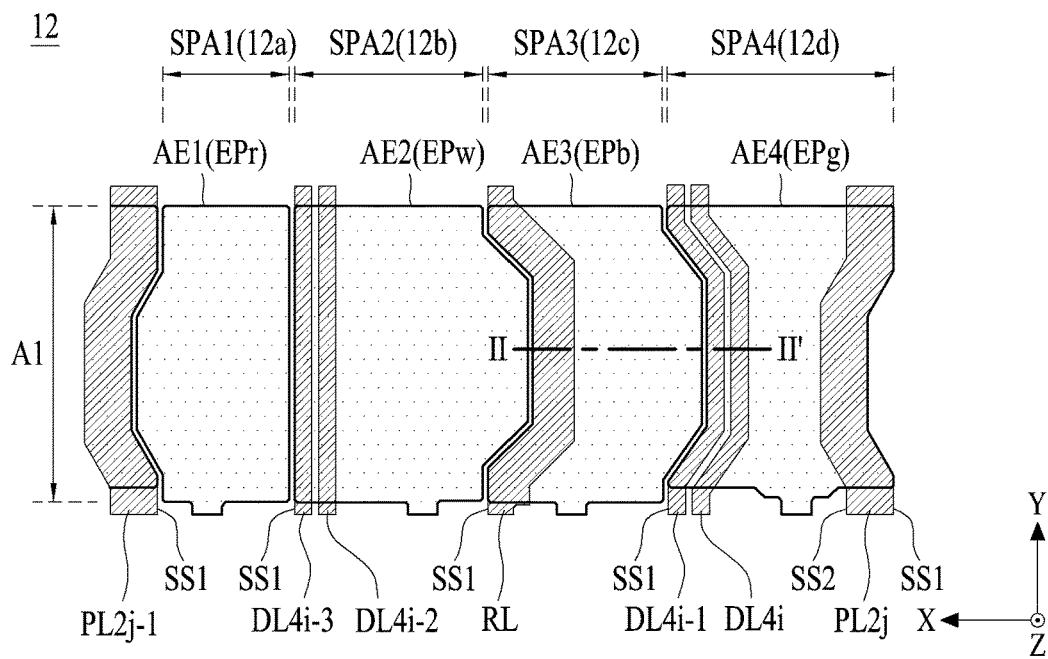
FIG. 10 is a view illustrating a light emission portion of a unit pixel according to another embodiment shown in FIG. 1.
Figure 11:
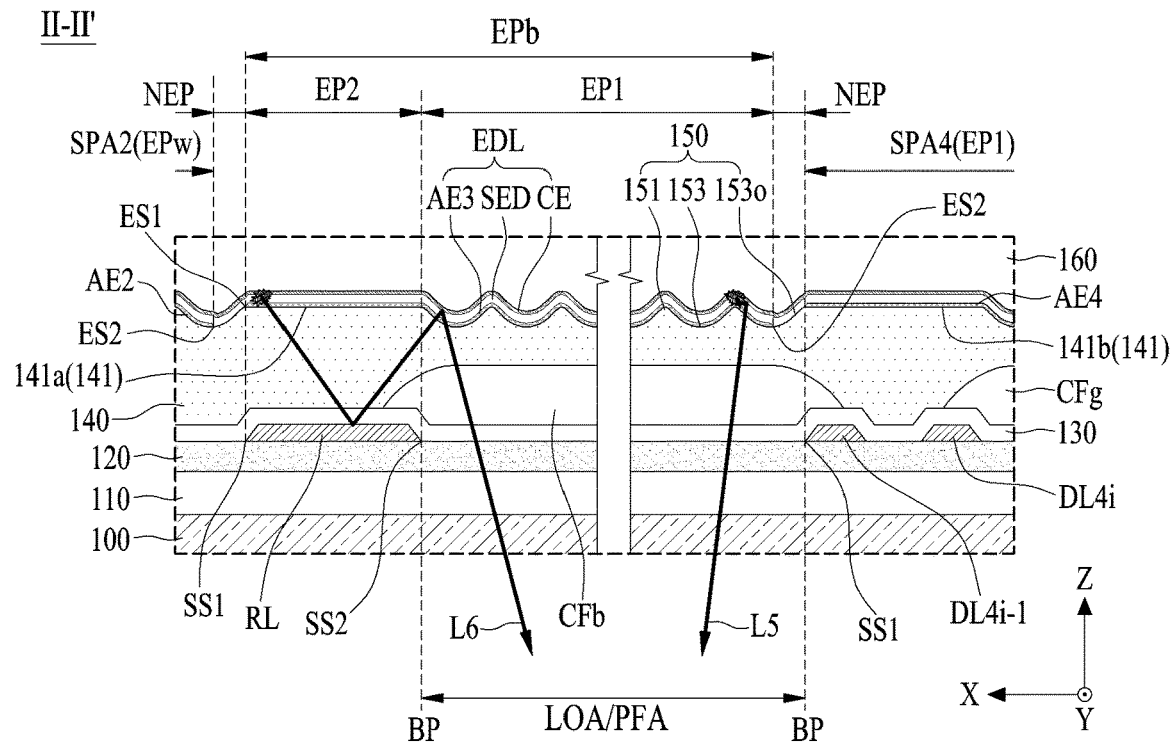
FIG. 11 is a cross-sectional view taken along line II-II' shown in FIG. 10.

FIG. 10 is a view illustrating a light emission portion of a unit pixel according to another embodiment shown in FIG. 1, and FIG. 11 is a cross-sectional view taken along line II-II' shown in FIG. 10, wherein each light emission portion of the second and third subpixel areas in the unit pixel shown in FIGS. 2 to 9 is modified. Therefore, in the following description, each light emission portion of the second and third subpixel areas and their repetitive descriptions are omitted or will be briefly described below, and the same reference numerals as those of FIGS. 2 to 9 will be given to the other elements and their repetitive descriptions are omitted or will be briefly described below.

Referring to FIGS. 10 and 11, in the unit pixel 12 according to another embodiment of the present disclosure, the second subpixel area SPA2 can include a white light emission portion EPw disposed between the first side SS1 of the (4i-3)th data line DL4i-3 and the first side SS1 of the reference voltage line RL.

Since the white light emission portion EPw is substantially the same as the white light emission portion EPw shown in FIGS. 2 and 7 except that the second end ES2 of the second anode electrode AE2 is disposed on the uneven pattern portion 150 without being disposed on the flat portion 141 of the overcoat layer 140 covering the reference voltage line RL, repetitive descriptions of the other elements except the second anode electrode AE2 will be omitted or briefly described.

A second end ES2 of the second anode electrode AE2 can be arranged at the outmost concave portion 153o of the uneven pattern portion 150. For example, the second end ES2 of the second anode electrode AE2 can be arranged on the bottom surface of the outmost concave portion 153o of the plurality of concave portions 153 to be electrically separated (or disconnected) from the third anode electrode AE3 disposed in the third subpixel area SPA3 adjacent thereto along the first direction X, but is not limited thereto. The second end ES2 of the second anode electrode AE2 can be arranged on an inclined surface of the outmost concave portion 153o within the range that the second end ES2 can electrically be separated (or disconnected) from the third anode electrode AE3.

The third subpixel area SPA3 can include a blue light emission portion EPb disposed between the first side SS1 of the reference voltage line RL and the first side SS1 of the (4i-1)th data line DL4i-1.

Since the blue light emission portion EPb is substantially the same as the blue light emission portion EPb shown in FIGS. 2 and 8 except that the third anode electrode AE3 is extended onto the flat portion of the overcoat layer 140 covering the reference voltage line RL, repetitive descriptions of the other elements except the third anode electrode AE3 will be omitted or briefly described.

The third anode electrode AE3 of the blue light emission portion EPb can be overlapped with the reference voltage line RL and spaced apart from the first side SS1 of the (4i-1)th data line DL4i-1.

A first end ES1 of the third anode electrode AE3 can be disposed on the flat portion 141 of the overcoat layer 140 covering (or overlaying) the reference voltage line RL. For example, the first end ES1 of the third anode electrode AE3 can be arranged on the first side SS1 of the reference voltage line RL or substantially be aligned.

A second end ES2 of the third anode electrode AE3 can be arranged at the outmost concave portion 153o of the uneven pattern portion 150 disposed in the blue light emission portion EPb. For example, the second end ES2 of the third anode electrode AE3 can be arranged on the bottom surface of the outmost concave portion 153o of the plurality of concave portions 153 to be electrically separated (or disconnected) from the fourth anode electrode AE4 disposed in the fourth subpixel area SPA4 adjacent thereto along the first direction X, but is not limited thereto. The second end ES2 of the third anode electrode AE3 can be arranged on an inclined surface of the outmost concave portion 153o within the range that the third anode electrode AE3 can electrically be separated (or disconnected) from the fourth anode electrode AE4.

As the third anode electrode AE3 is overlapped with the reference voltage line RL and disposed to be spaced apart from the first side SS1 of the (4i-1)th data line DL4i-1, the blue light emission portion EPb can include a first light emission portion EP1 disposed on the uneven pattern portion 150, and a second light emission portion EP2 disposed on the flat portion 141 of the overcoat layer 140 covering (or overlaying) the reference voltage line RL.

Since each of the first light emission portion EP1 and the second light emission portion EP2 of the blue light emission portion EPb is substantially the same as each of the first light emission portion EP1 and the second light emission portion EP2 of the white light emission portion EPw, and their repetitive descriptions are omitted.

As the blue light emission portion EPb of the fourth subpixel area SPA4 includes the first light emission portion EP1 disposed on the uneven pattern portion 150 of the overcoat layer 140 and the second light emission portion EP2 disposed on the flat portion 141 of the overcoat layer 140, light extraction efficiency of blue light can be increased by light L6 generated from the second light emission portion EP2.

For example, the fifth light L5 generated from the light emitting device layer EDL of the first light emission portion EP1 can be reflected by the uneven pattern portion 150 and then extracted (or outputted) toward the substrate 100. The sixth light L6 generated from the light emitting device layer EDL disposed in the second light emission portion EP2 of the blue light emission portion EPb can be reflected by the reference voltage line RL and then move to the uneven pattern portion 150. Then, the sixth light L6 can be again reflected by the uneven pattern portion 150, filtered by the blue color filter CFb and then extracted (or outputted) toward the substrate 100. Therefore, the blue light emission portion EPb can emit blue light, in which the fifth light L5 according to a light emission spectrum of the first light emission portion EP1 and the sixth light L6 according to a light emission spectrum of the second emission portion EP2 are mixed with each other, toward the substrate 100. For this reason, light extraction efficiency of the blue light can be increased and a color temperature of a white image can be increased. For example, since the blue light emitted from the blue light emission portion EPb of the third subpixel area SPA3 contributes to increase of the color temperature of the white image embodied in the unit pixel 12, in this embodiment, light extraction efficiency of the blue light emission portion EPb can be increased through the second light emission portion EP2, whereby white the color temperature of the white image embodied in the unit pixel 12 can be enhanced.

As described above, in the light emitting display apparatus that includes the unit pixel 12 according to another embodiment of the present disclosure, light extraction efficiency of the blue light emission portion EPb can be increased and therefore the color temperature of the white image can be increased in comparison with the light emitting display apparatus that includes the unit pixel 12 according to one embodiment shown in FIGS. 2 to 9.

Figure 12:
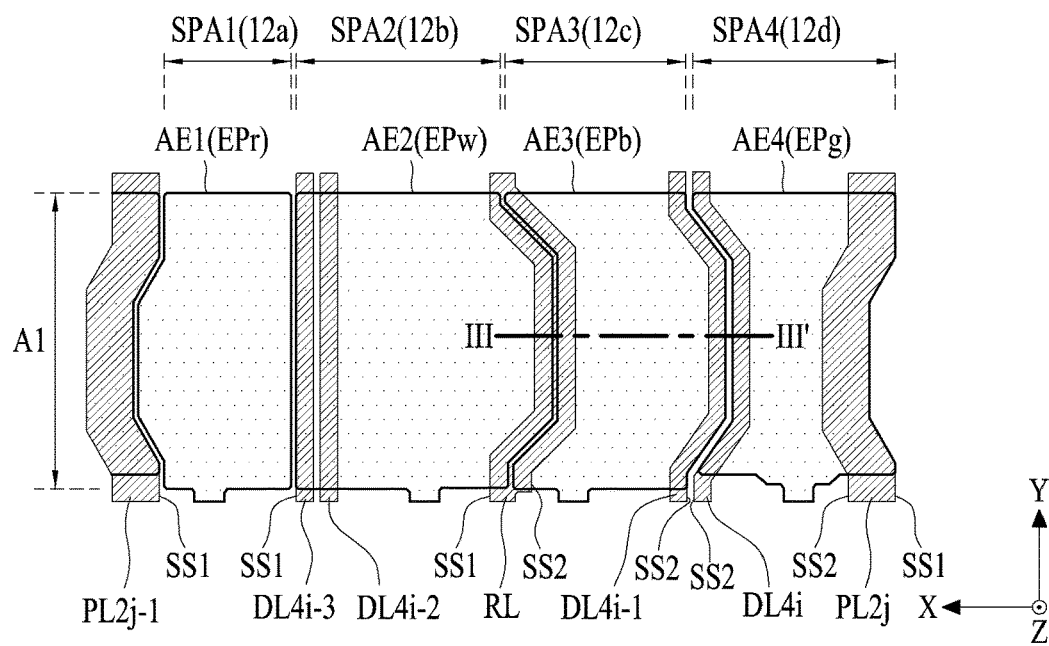
FIG. 12 is a view illustrating a light emission portion of a unit pixel according to other embodiment shown in FIG. 1.
Figure 13:
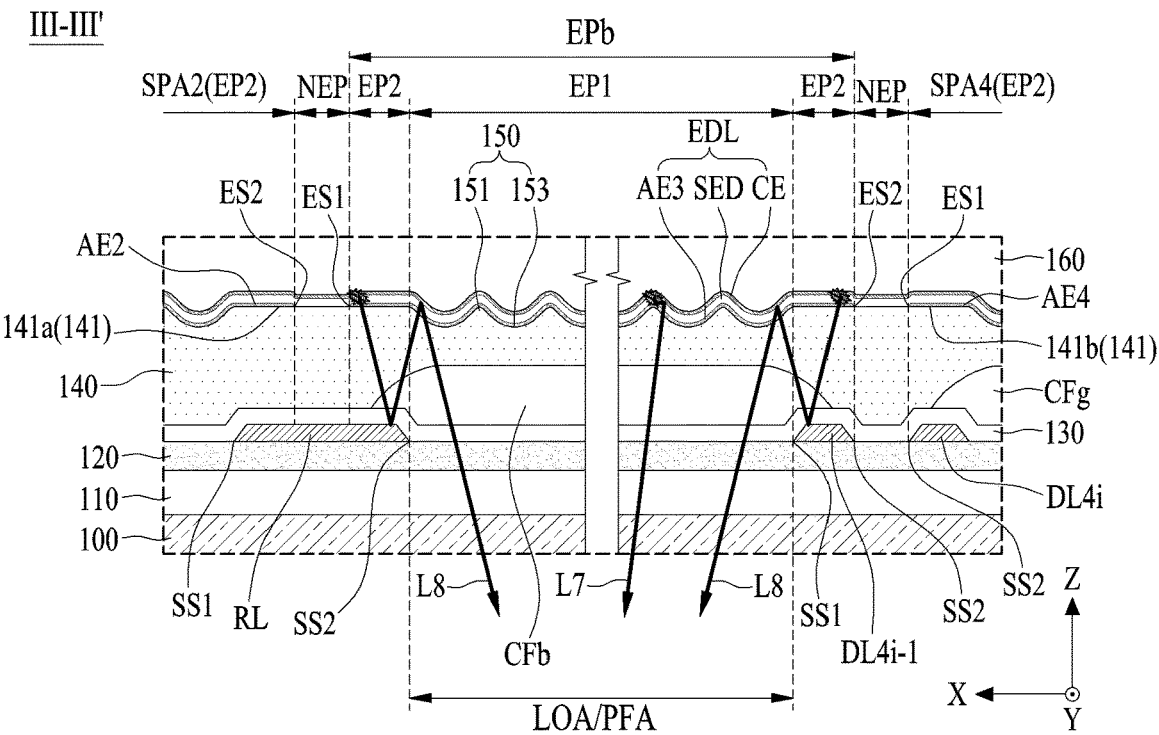
FIG. 13 is a cross-sectional view taken along line III-III' shown in FIG. 12.

FIG. 12 is a view illustrating a light emission portion of a unit pixel according to other embodiment shown in FIG. 1, and FIG. 13 is a cross-sectional view taken along line shown in FIG. 12, wherein an end position of an anode electrode disposed in each of a white light emission portion, a blue light emission portion and a green light emission portion in the unit pixel shown in FIGS. 10 and 11 is modified. Therefore, in the following description, each anode electrode of the white light emission portion, the blue light emission portion and the green light emission portion and its related elements will be described, and the same reference numerals as those of FIGS. 2 to 11 will be given to the other elements and their repetitive descriptions are omitted or will be briefly described below.

Referring to FIGS. 12 and 13, in the unit pixel 12 according to other embodiment of the present disclosure, since the white light emission portion EPw of the second subpixel area SPA2 is substantially the same as the white light emission portion EPw shown in FIGS. 2 and 7 except that the second end ES2 of the second anode electrode AE2 is arranged or aligned on the reference voltage line RL, repetitive descriptions of the other elements except the second anode electrode AE2 will be omitted or briefly described below.

The second end ES2 of the second anode electrode AE2 can be disposed on the flat portion 141 of the overcoat layer 140 covering (or overlaying) the reference voltage line RL. For example, when the reference voltage line RL has a middle portion between the first side SS1 and the second side SS2, the second end ES2 of the second anode electrode AE2 can be arranged or aligned between the first side SS1 and the middle portion of the reference voltage line RL.

Since the blue light emission portion EPb of the third subpixel area SPA3 is substantially the same as the blue light emission portion EPb shown in FIGS. 2 and 7 except that the third anode electrode AE3 is disposed on the uneven pattern portion 150 and the flat portion 141 of the overcoat layer 140 to cover (or overlay) the (4i-1)th data lien DL4i-1, the uneven pattern portion 150 and at least a portion of the reference voltage line RL, repetitive descriptions of the other elements except the third anode electrode AE3 will be omitted or briefly described below.

The first end ES1 of the third anode electrode AE3 can be disposed on the flat portion 141 of the overcoat layer 140 covering (or overlaying) the reference voltage line RL. For example, the first end ES1 of the third anode electrode AE3 can be arranged or aligned between the middle portion and the first side SS1 of the reference voltage line RL.

The second end ES2 of the third anode electrode AE3 can be disposed on the flat portion 141 of the overcoat layer 140 covering (or overlaying) the (4i-1)th data line DL4i-1. For example, the second end ES2 of the third anode electrode AE3 can be arranged or aligned at the second side SS2 of the (4i-1)th data line DL4i-1.

As the third anode electrode AE3 is overlapped with a portion of the reference voltage line RL and overlapped with the (4i-1)th data line DL4i-1, the blue light emission portion EPb can include a first light emission portion EP1 disposed on the uneven pattern portion 150, and the second light emission portion EP2 disposed on the flat portion 141 of the overcoat layer 140 covering (or overlaying) a portion of the reference voltage line RL and each of the (4i-1)th data line DL4i-1.

Since each of the first light emission portion EP1 and the second light emission portion EP2 of the blue light emission portion EPb is substantially the same as each of the first light emission portion EP1 and the second light emission portion EP2 of the white light emission portion EPw, and their repetitive descriptions are omitted.

As the blue light emission portion EPb includes the first light emission portion EP1 disposed on the uneven pattern portion 150 and the second light emission portion EP2 disposed on the flat portion 141 of the overcoat layer 140 covering (or overlaying) a portion of the reference voltage line RL and each of the (4i-1)th data line DL4i-1, light extraction efficiency of blue light can be more increased by light L8 generated from the second light emission portion EP2 than the blue light emission portion EPb shown in FIGS. 10 and 11.

For example, the seventh light L7 generated from the light emitting device layer EDL of the first light emission portion EP1 can be reflected by the uneven pattern portion 150 and then extracted (or outputted) toward the substrate 100. The eighth light L8 generated from the light emitting device layer EDL disposed in the second light emission portion EP2 of the blue light emission portion EPb can be reflected by the reference voltage line RL and then move to the uneven pattern portion 150. Then, the eighth light L8 can be again reflected by the uneven pattern portion 150, filtered by the blue color filter CFb and then extracted (or outputted) toward the substrate 100. Therefore, the blue light emission portion EPb can emit blue light, in which the seventh light L7 according to a light emission spectrum of the first light emission portion EP1 and the eighth light L8 according to a light emission spectrum of the second emission portion EP2 are mixed with each other, toward the substrate 100. For this reason, light extraction efficiency of the blue light can be more increased and a color temperature of a white image can be more increased.

Since the green light emission portion EPg of the fourth subpixel area SPA4 is substantially the same as the green light emission portion EPg shown in FIGS. 2 and 7 except that the first end ES1 of the fourth anode electrode AE4 is arranged or aligned on the (4i)th data line DL4i, repetitive description of the other elements except the fourth anode electrode AE4 will be omitted or briefly described below.

The first end ES1 of the fourth anode electrode AE4 can be disposed on the flat portion 141 of the overcoat layer 140 covering (or overlaying) the (4i)th data line DL4i. For example, the first end ES1 of the fourth anode electrode AE4 can be arranged or aligned on the second side SS of the (4i)th data line DL4i adjacent to the second side SS2 of the (4i-1)th data line DL4i-1.

As described above, in the light emitting display apparatus that includes the unit pixel 12 according to other embodiment of the present disclosure, light extraction efficiency of the blue light emission portion EPb can be more increased and therefore the color temperature of the white image can be more increased than the light emitting display apparatus that includes the unit pixel 12 according to another embodiment shown in FIGS. 10 and 11.

Figure 14:
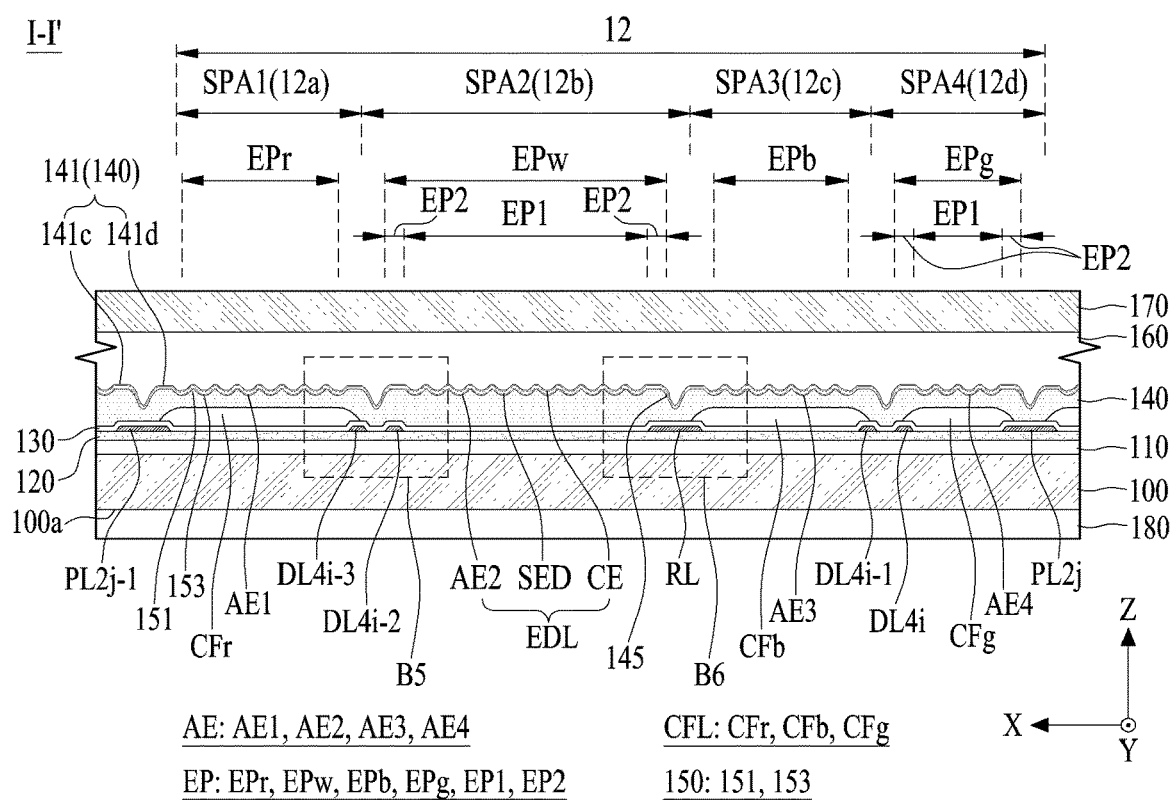
FIG. 14 is another cross-sectional view taken along line I-I' shown in FIG. 2.

FIG. 14 is another cross-sectional view taken along line I-I' shown in FIG. 2, wherein a groove pattern is additionally provided in the flat portion of the overcoat layer shown in FIGS. 2 to 13 and an end position of an anode electrode of each subpixel is modified. Therefore, in the following description, the groove pattern of the overcoat layer and its related elements will be described, and the same reference numerals as those of FIGS. 2 to 9 will be given to the other elements and their repetitive descriptions are omitted or will be briefly described below.

Referring to FIGS. 2 and 14, in the light emitting display apparatus according to this embodiment, the overcoat layer 140 can include an uneven pattern portion 150, a flat portion 141, and a groove portion 145.

The uneven pattern portion 150 is disposed in the light emission portion EP of each of the plurality of subpixel areas SPA1 to SPA4, and is substantially the same as the aforementioned uneven pattern portion and therefore their repetitive descriptions are omitted.

The flat portion 141 can be disposed on the metal lines PL, DL, RL and GL disposed in the plurality of subpixel areas SPA1 to SPA4. For example, the flat portion 141 can be embodied in a flat structure on the uneven pattern portion 150 disposed in each of the plurality of subpixel areas SPA1 to SPA4.

The groove portion 145 can be embodied to be recessed from the flat portion 141. The groove portion 145 can be embodied together with the uneven pattern portion 150.

According to one embodiment, the groove portion 145 can be formed to be recessed from the flat portion 141 covering (or overlaying) the (2j-1)th pixel driving voltage line PL2j-1 toward the (2j-1)th pixel driving voltage line PL2j-1. The groove portion 145 can be formed to be recessed from the flat portion 141 covering (or overlaying) the (4i-3)th data line DL4i-3 and the (4i-2)th data line DL4i-2 toward a region between the (4i-3)th data line DL4i-3 and the (4i-2)th data line DL4i-2. The groove portion 145 can be formed to be recessed from the flat portion 141 covering (or overlaying) the reference voltage line RL toward the reference voltage line RL. The groove portion 145 can be formed to be recessed from the flat portion 141 covering (or overlaying) the (4i-1)th data line DL4i-1 and the (4i)th data line DL4i toward a region between the (4i-1)th data line DL4i-1 and the (4i)th data line DL4i. The groove portion 145 can be formed to be recessed from the flat portion 141 covering (or overlaying) the (2j)th pixel driving voltage line PL2j toward the (2j)th pixel driving voltage line PL2j.

The groove portion 145 according to one embodiment can have a width of several hundreds of nanometers to several hundreds of micrometers, and can have the same depth as the thickness of the overcoat layer 140 or a depth smaller than the thickness of the overcoat layer 140. A shortest distance between the substrate 100 and the groove portion 145 can be shorter than the distance between the concave portion 153 of the uneven pattern portion 150 and the substrate 100. The bottom surface of the groove portion 145 can be arranged between the upper surface of the passivation layer 130 and the bottom surface of the concave portion 153. For example, when the groove portion 145 has the same depth as the thickness of the overcoat layer 140, the bottom surface of the groove portion 145 can be the upper surface of the passivation layer 130.

The groove portion 145 can include an inclined surface disposed between the light emission portions EP of adjacent subpixel areas SPA1 to SPA4. The inclined surface of the groove portion 145 can prevent a color mixture between the adjacent subpixel areas SPA1 to SPA4 from occurring by reflecting light from the light emission portion EP adjacent thereto. Also, the groove portion 145 is an area where anode electrodes disposed in the adjacent subpixel areas SPA1 to SPA4 are electrically detached from each other, and can be understood as an electrode separator.

The light emitting device layer EDL disposed on the groove portion 145 can include a groove corresponding to the groove portion 145. For example, the light emitting device layer EDL can include an inclined surface, a bottom surface, and a U shaped groove surrounded by the inclined surface and the bottom surface.

The flat portion 141 disposed on the (2j-1)th pixel driving voltage line PL2j-1 can include a first flat portion 141c and a second flat portion 141d, which are parallel with each other by interposing the groove portion 145. In this case, the first flat portion 141c can be overlapped with one side of the (2j-1)th pixel driving voltage line PL2j-1 and disposed between one side of the groove portion 145 and the uneven pattern portion 150 of the fourth subpixel area SPA4 disposed in a previous unit pixel 12. The second flat portion 141d can be overlapped with the other side of the (2j-1)th pixel driving voltage line PL2j-1 and disposed between the other side of the groove portion 145 and the uneven pattern portion 150 of the second subpixel area SPA2.

The flat portion 141 disposed on the (4i-3)th data line DL4i-3 and the (4i-2)th data line DL4i-2 can include a first flat portion 141c and a second flat portion 141d, which are parallel with each other by interposing the groove portion 145. In this case, the first flat portion 141c can be overlapped with the (4i-3)th data line DL4i-3 and disposed between one side of the groove portion 145 and the uneven pattern portion 150 of the first subpixel area SPA1. The second flat portion 141d can be overlapped with the (4i-2)th data line DL4i-2 and disposed between the other side of the groove portion 145 and the uneven pattern portion 150 of the second subpixel area SPA2.

The flat portion 141 disposed on the reference voltage line RL can include a first flat portion 141c and a second flat portion 141d, which are parallel with each other by interposing the groove portion 145. In this case, the first flat portion 141c can be overlapped with one side of the reference voltage line RL and disposed between one side of the groove portion 145 and the uneven pattern portion 150 of the second subpixel area SPA2. The second flat portion 141d can be overlapped with the other side of the reference voltage line RL and disposed between the other side of the groove portion 145 and the uneven pattern portion 150 of the third subpixel area SPA3.

The flat portion 141 disposed on the (4i-1)th data line DL4i-1 and the (4i)th data line DL4i can include a first flat portion 141c and a second flat portion 141d, which are parallel with each other by interposing the groove portion 145. In this case, the first flat portion 141c can be overlapped with the (4i-1)th data line DL4i-1 and disposed between one side of the groove portion 145 and the uneven pattern portion 150 of the third subpixel area SPA3. The second flat portion 141d can be overlapped with the (4i)th data line DL4i and disposed between the other side of the groove portion 145 and the uneven pattern portions 150 of the fourth subpixel area SPA4.

The flat portion 141 disposed on the (2j)th pixel driving voltage line PL2j can include a first flat portion 141c and a second flat portion 141d, which are parallel with each other by interposing the groove portion 145. In this case, the first flat portion 141c can be overlapped with one side of the (2j)th pixel driving voltage line PL2j and disposed between one side of the groove portion 145 and the uneven pattern portion 150 of the third subpixel area SPA3. The second flat portion 141d can be overlapped with the other side of the (2j)th pixel driving voltage line PL2j and connected with the other side of the groove portion 145 and the uneven pattern portion 150 of the first subpixel area SPA1 disposed in next unit pixel 12.

According to one embodiment, some subpixel areas SPA2 and SPA4 of the plurality of subpixel areas SPA1 to SPA4 can include a first light emission portion EP1 disposed on the uneven pattern portion 150 embodied in the overcoat layer 140, and a second light emission portion EP2 disposed on the flat portion 141 and at least a portion of the groove portion 145 embodied in the overcoat layer 140. The other subpixel areas SPA1 and SPA3 except some subpixel areas SPA2 and SPA4 of the plurality of subpixel areas SPA1 to SPA4 can include only one light emission portion EPr or EPb disposed on the uneven pattern portion 150 embodied in the overcoat layer 140.

According to one embodiment, the light emitting device layer EDL disposed in some subpixel areas SPA2 and SPA4 of the plurality of subpixel areas SPA1 to SPA4 can have a surface morphology corresponding to that of the overcoat layer 140 that includes the uneven pattern portion 150, the flat portion 141 and the groove portion 145. For example, the light emitting device layer ELD disposed in some subpixel areas SPA2 and SPA4 of the plurality of subpixel areas SPA1 to SPA4 can include an uneven structure disposed on the uneven pattern portion 150, a flat structure disposed on the flat portion 141, and a curved structure disposed in at least a portion of the groove portion 145.

Figure 15:
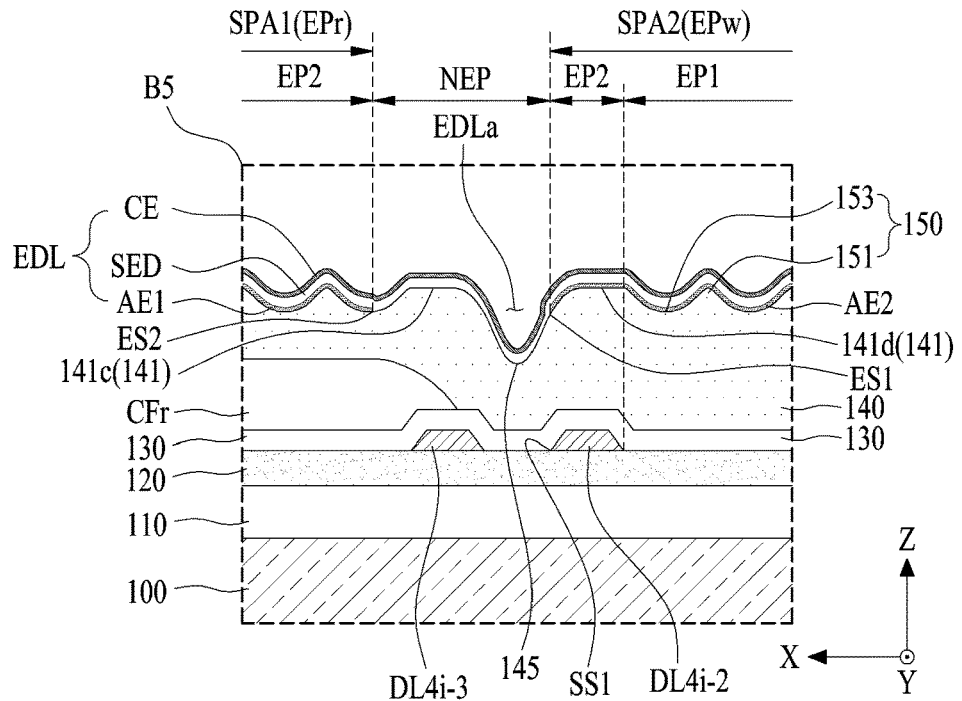
FIG. 15 is an enlarged view illustrating a region 'B5' shown in FIG. 14.
Figure 16:
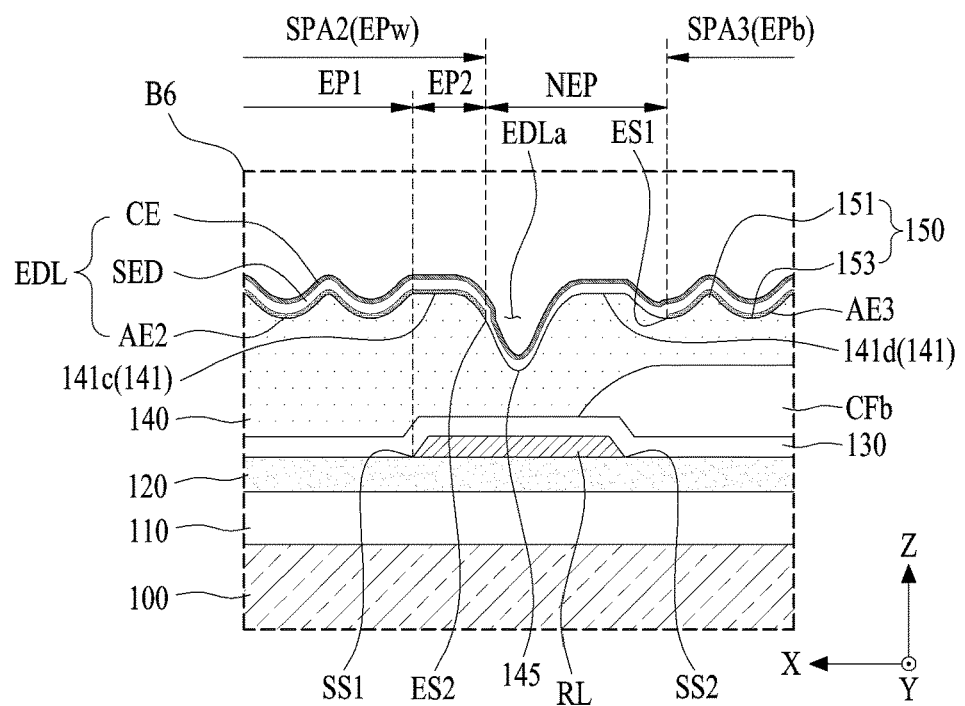
FIG. 16 is an enlarged view illustrating a region 'B6' shown in FIG. 14.

FIG. 15 is an enlarged view illustrating a region 'B5' shown in FIG. 14, and FIG. 16 is an enlarged view illustrating a region 'B6' shown in FIG. 14, wherein a white light emission portion is disposed in the second subpixel area.

Referring to FIGS. 14 to 16, the white light emission portion EPw disposed in the second subpixel area SPA2 can include a first light emission portion EP1 disposed on the uneven pattern portion 150 of the overcoat layer 140, and a second light emission portion EP2 disposed on the flat portion 141 and at least a portion of the groove portion 145 embodied in the overcoat layer 140. Since the white light emission portion EPw is substantially the same as the white light emission portion EPw shown in FIGS. 2 and 7 except that each of the first end ES1 and the second end ES2 of the second anode electrode AE2 is arranged in at least a portion of the groove portion 145 adjacent thereto, repetitive descriptions of the other elements except the second anode electrode AE2 will be omitted or briefly described below.

A first end ES1 of the second anode electrode AE2 can be arranged in at least a portion of the groove portion 145 disposed on the (4i-2)th data line DL4i-2 (or the first metal line or the second metal signal line). The first end ES1 of the second anode electrode AE2 can be arranged between the second flat portion 141d of the flat portion 141 covering (or overlaying) the (4i-2)th data line DL4i-2 and the bottom surface of the groove portion 145. For example, the first end ES1 of the second anode electrode AE2 can be arranged on the inclined surface of the groove portion 145 connected to the second flat portion 141d or the bottom surface of the groove portion 145 such that it can be aligned in the first side SS1 of the (4i-2)th data line DL4i-2.

A second end ES2 of the second anode electrode AE2 can be arranged in at least a portion of the groove portion 145 disposed on the reference voltage line RL (or the second metal line). The second end ES2 of the second anode electrode AE2 can be arranged between the first flat portion 141c of the flat portion 141 covering (or overlaying) the reference voltage line RL and the bottom surface of the groove portion 145. For example, the second end ES2 of the second anode electrode AE2 can be arranged on the inclined surface of the groove portion 145 connected to the first flat portion 141c or the bottom surface of the groove portion 145.

The portion between the second end ES2 of the first anode electrode AE1 disposed in the first subpixel area SPA1 and the first end ES1 of the second anode electrode AE2 disposed in the second subpixel area SPA2 can be defined as a non-light emission portion (NEP) because the anode electrodes AE1 and AE2 are not disposed there.

As the self-light emitting device SED of the light emitting device layer EDL can directly be in contact with a portion of the flat portion 141 of the overcoat layer 140 and the second anode electrode AE2 and a portion of the groove portion 145, the self-light emitting device SED of the light emitting device layer EDL can be embodied to have a surface morphology corresponding to the portion of the flat portion 141 of the overcoat layer 140 and the second anode electrode AE2 and the portion of the groove portion 145. The self-light emitting device SED can include a recessed groove EDLa corresponding to the groove portion 145 of the overcoat layer 140.

The cathode electrode CE of the light emitting device layer EDL can be embodied to have a morphology that follows the surface morphology of the self-light emitting device SED as it is. At this time, the cathode electrode CE can include a recessed groove EDLa corresponding to the groove portion 145 of the overcoat layer 140. The groove EDLa of the cathode electrode CE can reflect light leakage components from the first and second subpixel areas SPA1 and SPA2 and allow the light leakage components to progress toward the corresponding subpixel areas SPA1 and SPA2, thereby minimizing or preventing a light leakage phenomenon in which light leakage components from another adjacent subpixel area are extracted (or outputted) toward the substrate 100. Therefore, the groove EDLa of the cathode electrode CE can serve as a reflective electrode.

Meanwhile, each of the first end ES1 and the second end ES2 of the second anode electrode AE2 is not arranged on a portion of the groove portion 145. The first end ES1 of the second anode electrode AE2 is not arranged between the first flat portion 141c of the overcoat layer 140 covering (or overlaying) the (4i-3)th data line DL4i-3 and the bottom surface of the groove portion 145. Also, the second end ES2 of the second anode electrode AE2 is not arranged between the second flat portion 141d of the overcoat layer 140 covering (or overlaying) the reference voltage line RL and the bottom surface of the groove portion 145.

For example, when the first end ES1 of the second anode electrode AE2 is disposed to cover (or overlay) the entire groove portion 145, the light emission portion can be embedded on the groove portion 145. However, light generated from the light emission portion embedded between the first flat portion 141c of the overcoat layer 140 and the bottom surface of the groove portion 145 can be reflected toward the first subpixel area SPA1 without progressing to the second subpixel area SPA2 due to the groove portion 145 and therefore act as a light leakage component entering the first subpixel area SPA1 from the second subpixel area SPA2, whereby luminance and a color reproduction rate of the first subpixel 12a can be deteriorated. In order to prevent the light leakage component from occurring, the first end ES1 of the second anode electrode AE2 is not arranged between the first flat portion 141c of the overcoat layer 140 and the bottom surface of the groove portion 145 but arranged between the second flat portion 141d of the overcoat layer 140 and the bottom surface of the groove portion 145.

For example, when the second end ES2 of the second anode electrode AE2 is disposed to cover (or overlay) the entire groove portion 145 disposed on the reference voltage line RL, the light emission portion can be embedded on the groove portion 145. However, light generated from the light emission portion embodied between the second flat portion 141d of the overcoat layer 140 and the bottom surface of the groove portion 145 can be reflected toward the third subpixel area SPA3 without progressing to the second subpixel area SPA2 due to the groove portion 145 and therefore act as a light leakage component entering the third subpixel area SPA3 from the second subpixel area SPA2, whereby luminance and a color reproduction rate of the third subpixel 12c can be deteriorated. In order to prevent the light leakage component from occurring, the second end ES2 of the second anode electrode AE2 is not arranged between the second flat portion 141d of the overcoat layer 140 and the bottom surface of the groove portion 145 but arranged between the first flat portion 141c of the overcoat layer 140 and the bottom surface of the groove portion 145.

The green light emission portion EPg disposed in the fourth subpixel area SPA4 according to this embodiment can include a first light emission portion EP1 disposed on the uneven pattern portion 150 of the overcoat layer 140, and a second light emission portion EP2 disposed on the flat portion 141 and at least a portion of the groove portion 145 embodied in the overcoat layer 140. Since the green light emission portion EPg is substantially the same as the aforementioned white light emission portion EPw except that the first end of the third anode electrode AE3 is arranged in at least a portion of the groove portion 145 disposed on the (4i)th data line DL4i and the (2j)th pixel driving voltage line PL2j and the second end of the third anode electrode AE3 is arranged in at least a portion of the groove portion 145 disposed on the (2j)th pixel driving voltage line PL2j, and their repetitive descriptions are omitted.

Figure 17:
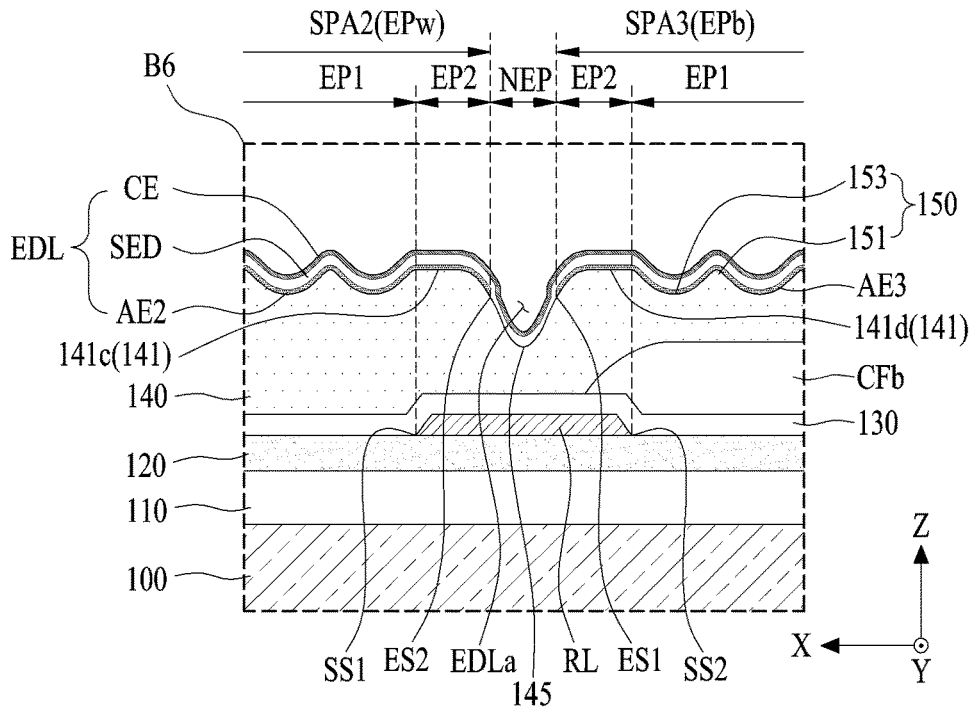
FIG. 17 is another enlarged view illustrating a region 'B6' shown in FIG. 14.

FIG. 17 is another enlarged view illustrating a region 'B6' shown in FIG. 14, wherein the structure of the third anode electrode disposed in the third subpixel area shown in FIGS. 14 and 16 is modified. Therefore, in the following description, the third anode electrode and its related elements will be described, and their repetitive descriptions are omitted or will be briefly described below.

Referring to FIGS. 12 and 17, the first end ES1 of the third anode electrode AE3 of the blue light emission portion EPb disposed in the third subpixel area SPA3 according to one embodiment can be arranged in at least a portion of the groove portion 145 disposed on the reference voltage line RL. The first end ES1 of the third anode electrode AE3 can be arranged between the second flat portion 141d of the flat portion 141 covering (or overlaying) the reference voltage line RL and the bottom surface of the groove portion 145. For example, the first end ES1 of the third anode electrode AE3 can be arranged on the inclined surface of the groove portion 145 connected to the second flat portion 141d or the bottom surface of the groove portion 145. Therefore, the blue light emission portion EPb disposed in the third subpixel area SPA3 can include a first light emission portion EP1 disposed on the uneven pattern portion 150, and a second light emission portion EP2 disposed on the flat portion 141 and at least a portion of the groove portion 145 embodied in the overcoat layer 140 covering (or overlaying) the reference voltage line RL. Since the blue light emission portion EPb is substantially the same as the blue light emission portion EPb shown in FIGS. 12 and 13 except that a portion of the second light emission portion EP2 is arranged on the groove portion 145, and their repetitive descriptions are omitted.

The portion between the second end ES2 of the second anode electrode AE2 disposed on the reference voltage line RL and the first end ES1 of the third anode electrode AE3 disposed in the third subpixel area SPA3 can be defined as a non-light emission portion (NEP) because the anode electrodes AE2 and AE3 are not disposed there.

Figure 18:
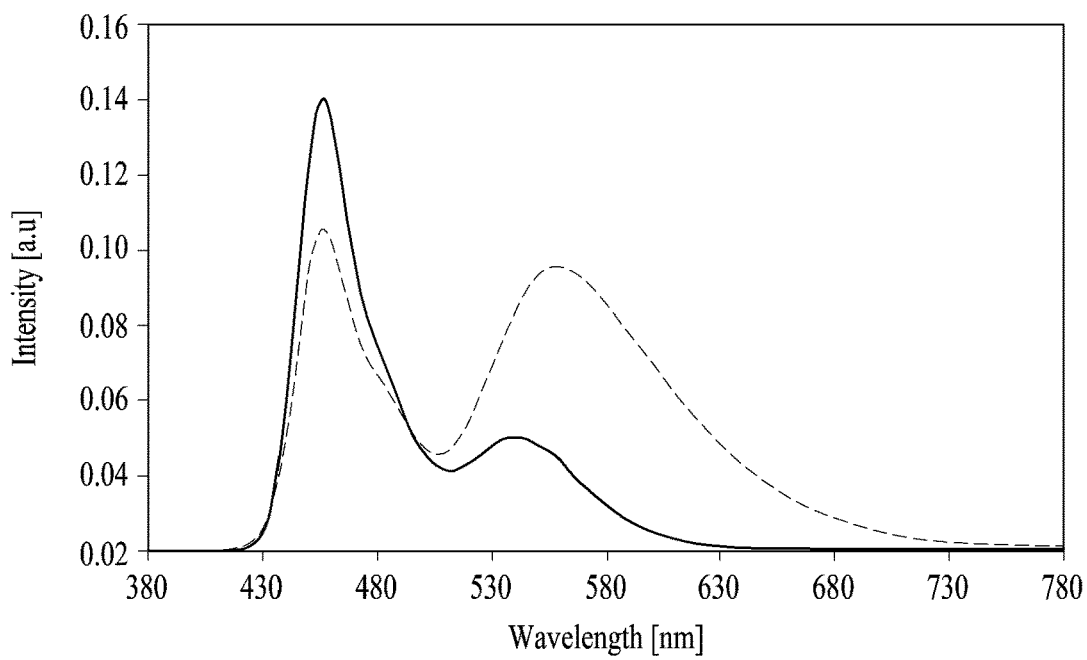
FIG. 18 is a graph illustrating intensity per wavelength for a first light emission portion and a second light emission portion of a white subpixel according to one embodiment of the present disclosure.

FIG. 18 is a graph illustrating intensity per wavelength for a first light emission portion and a second light emission portion of a white subpixel according to one embodiment of the present disclosure. In FIG. 18, a dotted line denotes intensity (or strength) per wavelength of the first light emission portion, and a solid line denotes intensity (or strength) per wavelength of the second light emission portion.

As seen on FIG. 18, it is noted that the light generated from the second light emission portion of the white subpixel according to one embodiment of the present disclosure has a light emission spectrum in which intensity of a blue wavelength is increased and intensity of a yellow-green wavelength is low in comparison with the first light emission portion. Therefore, it is noted that the light generated from the second light emission portion of the white subpixel has the increased intensity of the blue wavelength in comparison with the intensity of the yellow-green wavelength to emit light having a high color temperature. For example, when the self-light emitting device emitting white light has a deposited structure of a first blue organic light emitting layer, a yellow-green organic light emitting layer and a second blue organic light emitting layer, a yellow-green resonant peak moves to a blue peak wavelength in the second light emission portion, whereby cool white light having a relatively high color temperature can be emitted.

Figure 19:
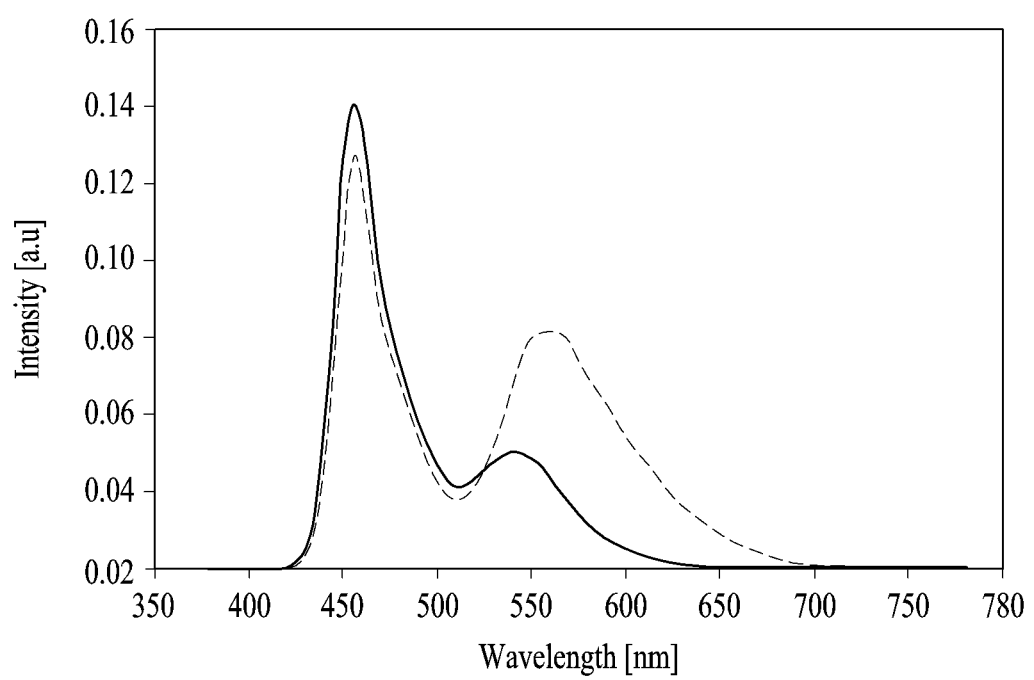
FIG. 19 is a graph illustrating intensity per wavelength for a white subpixel according to one embodiment of the present disclosure and a white subpixel according to a comparison example.

FIG. 19 is a graph illustrating intensity per wavelength for a white subpixel according to one embodiment of the present disclosure and a white subpixel according to a comparison example. In FIG. 19, a dotted line denotes intensity (or strength) per wavelength of the white subpixel according to the comparison example, and a solid line denotes intensity (or strength) per wavelength of the white subpixel according to one embodiment of the present disclosure. The white subpixel according to the comparison example includes only one light emission portion disposed on an uneven pattern portion, and the white subpixel according to the present disclosure includes a first light emission portion disposed on an uneven pattern portion and a second light emission portion disposed on a flat portion.

As seen in FIG. 19, it is noted that light generated from the white subpixel according to the present disclosure has a light emission spectrum in which intensity of a blue wavelength is increased and intensity of a yellow-green wavelength is lower in comparison with the white subpixel according to the comparison example. For example, the white light emitted from the white subpixel according to the present disclosure has increased intensity of the blue wavelength and lowered intensity of the yellow-green wavelength, in comparison with the white subpixel according to the comparison example, due to a mixture of the first light emitted from the first light emission portion to have a light emission spectrum such as the dotted line shown in FIG. 18 and the second light emitted from the second light emission portion to have a light emission spectrum such as the solid line shown in FIG. 19. Therefore, the white subpixel according to the present disclosure can emit white light having a high color temperature, for example, cool white light. As a result, the light emitting display apparatus according to the present disclosure can improve luminance and a color temperature of a display image.

As described above, although the light emitting display apparatus according to one or more embodiments of the present disclosure describes that the light emission portion disposed in some subpixels of the plurality of subpixels includes the second light emission portion overlapped with at least a portion of the metal lines adjacent thereto along the first direction X, but the present disclosure is not limited thereto. The light emission portion disposed in some subpixels of the plurality of subpixels can further the third light emission portion overlapped with at least a portion of the metal lines adjacent thereto along the second direction Y as well as the metal lines adjacent thereto along the first direction X. For example, the light emission portion disposed in some subpixels of the plurality of subpixels can further include a first light emission portion disposed on the uneven pattern portion of the overcoat layer, a second light emission portion disposed on the flat portion or the groove portion of the overcoat layer covering (or overlaying) metal lines adjacent thereto along the first direction X, and a third light emission portion disposed on the flat portion or the groove portion of the overcoat layer covering (or overlaying) gate lines adjacent thereto along the second direction Y. In this case, the light emitted from the third light emission portion can be mixed with the light emitted from each of the first and second light emission portions, whereby luminance and the color temperature of the display image can be more improved A light emitting display apparatus according to one or more embodiments of the present disclosure will be described below.

A light emitting display apparatus according to some embodiments of the present disclosure can include a substrate, a first metal line and a second metal line spaced apart from each other along a first direction on the substrate and disposed along a second direction crossing the first direction, and a subpixel overlapped with at least one of the first metal line and the second metal line, wherein the subpixel can include a first light emission portion between the first metal line and the second metal line, and a second light emission portion overlapped with at least one of the first metal line and the second metal line.

According to some embodiments of the present disclosure, the first light emission portion can include an uneven pattern portion, and the second light emission portion can include a flat portion.

A light emitting display apparatus according to some embodiments of the present disclosure can further include an overcoat layer disposed in the first light emission portion and the second light emission portion, and overlaying the first metal line and the second metal line, wherein the overcoat layer can include an uneven pattern portion in the first light emission portion, and a non-pattern portion in the second light emission portion.

A light emitting display apparatus according to some embodiments of the present disclosure can further include an overcoat layer disposed in the first light emission portion and the second light emission portion, and overlaying the first metal line and the second metal line, wherein the subpixel can include an anode electrode on the overcoat layer of the first light emission portion and the second light emission portion, a self-light emitting device on the anode electrode, and a cathode electrode on the self-light emitting device.

According to some embodiments of the present disclosure, the overcoat layer can include an uneven pattern portion in the first light emission portion, and a non-pattern portion in the second light emission portion, wherein the anode electrode can include a surface morphology that follows a surface morphology of the uneven pattern portion and the non-pattern portion.

A light emitting display apparatus according to some embodiments of the present disclosure can further include an overcoat layer disposed in the first light emission portion and the second light emission portion, and covering the first metal line and the second metal line, wherein the overcoat layer can include an uneven pattern portion in the first light emission portion, a flat portion in the second light emission portion, and a groove portion recessed from the flat portion.

According to some embodiments of the present disclosure, the subpixel can include an anode electrode on the uneven pattern portion, the flat portion, and the groove portion of the overcoat layer, a self-light emitting device on the anode electrode, and a cathode electrode on the self-light emitting device.

According to some embodiments of the present disclosure, the flat portion of the overcoat layer can include a first flat portion connected to one side of the groove portion, and a second flat portion between the other side of the groove portion and the uneven pattern portion, wherein the subpixel can include an anode electrode on the uneven pattern portion, the second flat portion, and a portion of the groove portion of the overcoat layer, a self-light emitting device on the anode electrode, and a cathode electrode on the self-light emitting device.

A light emitting display apparatus according to some embodiments of the present disclosure can further include an overcoat layer disposed in the first light emission portion and the second light emission portion, and overlaying the first metal line and the second metal line, wherein the first metal line can include a first metal signal line, and a second metal signal line between the first metal signal line and the second metal line, wherein the second light emission portion can be overlapped with at least one of the first metal signal line, the second metal signal line, and the second metal line, wherein the overcoat layer can include an uneven pattern portion in the first light emission portion, a flat portion on the first metal signal line and the second metal signal line, and a groove portion recessed from the flat portion between the first metal signal line and the second metal signal line.

According to some embodiments of the present disclosure, the subpixel can include an anode electrode on the uneven pattern portion, the flat portion, and the groove portion of the overcoat layer, a self-light emitting device on the anode electrode, and a cathode electrode on the self-light emitting device.

According to some embodiments of the present disclosure, the flat portion of the overcoat layer can include a first flat portion on the first metal signal line, and a second flat portion on the second metal signal line and connected to the uneven pattern portion, wherein the subpixel can include an anode electrode on the uneven pattern portion, the second flat portion, and a portion the groove portion of the overcoat layer, a self-light emitting device on the anode electrode, and a cathode electrode on the self-light emitting device.

A light emitting display apparatus according to some embodiments of the present disclosure can include a substrate having a plurality of subpixel areas disposed along a first direction and a second direction crossing the first direction, a plurality of metal lines extended along the second direction and disposed in the plurality of subpixel areas, and a light emission portion in each of the plurality of subpixel areas, wherein the light emission portion disposed in some subpixel areas of the plurality of subpixel areas can be overlapped with at least one metal line adjacent along the first direction among the plurality of metal lines.

According to some embodiments of the present disclosure, the light emission portion disposed in the other subpixel areas except some subpixel areas of the plurality of subpixel areas can be not overlapped with two metal lines adjacent along the first direction among the plurality of metal lines.

According to some embodiments of the present disclosure, a first metal line and a second metal line of the plurality of metal lines can be disposed in some subpixel areas to be spaced apart from each other along the first direction, and the light emission portion disposed in the some subpixel areas can be overlapped with at least one of the first metal line and the second metal line.

According to some embodiments of the present disclosure, a first metal line and a second metal line of the plurality of metal lines can be disposed in some subpixel areas to be spaced apart from each other along the first direction, and the light emission portion disposed in the some subpixel areas can include a first light emission portion between the first metal line and the second metal line, and a second light emission portion overlapped with at least one of the first metal line and the second metal line.

According to some embodiments of the present disclosure, a light emission portion of a first subpixel area of the plurality of subpixel areas emits red light, a light emission portion of a second subpixel area of the plurality of subpixel areas can emit white light, a light emission portion of a third subpixel area of the plurality of subpixel areas can emit blue light, and a light emission portion of a fourth subpixel area of the plurality of subpixel areas can emit green light, and wherein some subpixel areas of the plurality of subpixel areas can the second subpixel area and the fourth subpixel area or the second to fourth subpixel areas.

According to some embodiments of the present disclosure, the second light emission portion can be overlapped with at least one of the first metal line and the second metal line within a range of a half or more based on the first direction.

According to some embodiments of the present disclosure, each of the first metal line and the second metal line can include a first side adjacent to the first light emission portion, a second side opposite to the first side, and a middle portion between the first side and the second side, and based on the first direction, an end of the second light emission portion can be arranged between the middle portion of each of the first metal line and the second metal line and the second side.

According to some embodiments of the present disclosure, the first metal line can include a first metal signal line, and a second metal signal line between the first metal signal line and the second metal line, wherein the second light emission portion can be overlapped with at least one of the first metal signal line, the second metal signal line, and the second metal line.

According to some embodiments of the present disclosure, the first light emission portion can include an uneven pattern portion, and wherein the second light emission portion can include a flat portion on the first metal signal line and the second metal signal line, and a groove portion recessed from the flat portion between the first metal signal line and the second metal signal line.

The light emitting display apparatus according to an embodiment of the present disclosure can be applied to various applications. The light emitting display apparatus according to an embodiment of the present disclosure can be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc.

The above-described features, structures, and effects of the present disclosure are included in at least one embodiment of the present disclosure, but are not limited to only one embodiment. Furthermore, the features, structures, and effects described in at least one embodiment of the present disclosure can be embedded through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A light emitting display apparatus comprising:
a first metal pixel driving line disposed along a first direction on a substrate;
first and second metal data lines spaced apart from the first metal pixel driving line and disposed along the first direction on the substrate;
a reference voltage metal line spaced apart from the second metal data line and disposed along the first direction on the substrate;
third and fourth metal data lines spaced apart from the reference voltage metal line and disposed along the first direction on the substrate;
a second metal pixel driving line spaced apart from the reference voltage metal line and disposed along the first direction on the substrate;
a first subpixel disposed between the first metal pixel driving line and the first metal data line;
a second subpixel disposed between the first metal data line and the reference voltage metal line;
a third subpixel disposed between the reference voltage metal line and the third metal data line; and
a fourth subpixel disposed between the third metal data line and the second metal pixel driving line; and
an overcoat layer overlaying the first metal pixel driving line, the first and second metal data lines, the reference voltage metal line, the third and fourth metal data lines, and the second metal pixel driving line, wherein the second subpixel includes:
a first light emission portion disposed on a region between the second metal data line and the reference voltage metal line; and
a second light emission portion at a first side of the first light emission portion and overlapped with the first and second metal data lines and at a second side of the first light emission portion and overlapped with the reference voltage metal line,
wherein in the first light emission portion of the second subpixel, an upper surface of the overcoat layer includes an uneven pattern portion, and
wherein in the second light emission portions of the second subpixel, the upper surface of the overcoat layer is flat.

2. The light emitting display apparatus of claim 1, wherein the second subpixel further includes:
an anode electrode on the overcoat layer of the first light emission portion and the second light emission portion;
a self-light emitting device on the anode electrode; and
a cathode electrode on the self-light emitting device.

3. The light emitting display apparatus of claim 2, wherein the anode electrode includes a surface morphology that follows a surface morphology of the uneven pattern portion and the flat upper surface of the overcoat layer.

4. The light emitting display apparatus of claim 1, wherein the overcoat layer includes:
a groove portion recessed from the flat upper surface of the overcoat layer.

5. The light emitting display apparatus of claim 4, wherein the second subpixel further includes:
an anode electrode on the uneven pattern portion, the flat upper surface of the overcoat layer, and the groove portion of the overcoat layer;
a self-light emitting device on the anode electrode; and
a cathode electrode on the self-light emitting device.

6. The light emitting display apparatus of claim 4, wherein the flat upper surface of the overcoat layer includes a first flat portion connected to one side of the groove portion, and a second flat portion connected between the other side of the groove portion and the uneven pattern portion, and
wherein the second subpixel further includes:
an anode electrode on the uneven pattern portion, the second flat portion, and a portion of the groove portion of the overcoat layer;
a self-light emitting device on the anode electrode; and
a cathode electrode on the self-light emitting device.

7. A light emitting display apparatus comprising:
a substrate having a plurality of pixel areas disposed along a first direction and a second direction crossing the first direction,
wherein each pixel area includes:
a first metal pixel driving line disposed along the first direction on the substrate;
first and second metal data lines spaced apart from the first metal pixel driving line and disposed along the first direction on the substrate;
a reference voltage metal line spaced apart from the second metal data line and disposed along the first direction on the substrate;
third and fourth metal data lines spaced apart from the reference voltage metal line and disposed along the first direction on the substrate;
a second metal pixel driving line spaced apart from the reference voltage metal line and disposed along the first direction on the substrate;
first and second gate lines disposed along the second direction crossing the first direction;
a first subpixel disposed between the first metal pixel driving line and the first metal data line;
a second subpixel disposed between the first metal data line and the reference voltage metal line;
a third subpixel disposed between the reference voltage metal line and the third metal data line; and
a fourth subpixel disposed between the third metal data line and the second metal pixel driving line; and
an overcoat layer overlaying the first metal pixel driving line, the first and second metal data lines, the reference voltage metal data line, the third and fourth metal data lines, and the second metal pixel driving line,
wherein the second subpixel includes:
a first light emission portion not overlapping the second metal data line and the reference voltage metal line; and
a second light emission portion at a first side of the first light emission portion and overlapping the first and second metal data lines and at a second side of the first light emission portion and overlapping the reference voltage metal line,
wherein in the first light emission portion of the second subpixel, an upper surface of the overcoat layer includes an uneven pattern portion, and
wherein in the second light emission portions of the second subpixel, the upper surface of the overcoat layer includes a non-pattern portion.

8. The light emitting display apparatus of claim 7, wherein the fourth subpixel includes:
a first light emission portion not overlapping the fourth metal data line and the second metal pixel driving line; and
a second light emission portion at a first side of the first light emission portion and overlapping the third and fourth metal data lines and at a second side of the first light emission portion and overlapping the second metal pixel driving line,
wherein in the first light emission portion of the fourth subpixel, the upper surface of the overcoat layer includes the uneven pattern portion, and
wherein in the second light emission portions of the fourth subpixel, the upper surface of the overcoat layer includes the non-pattern portion.

9. The light emitting display apparatus of claim 8, wherein the first subpixel includes:
a light emission portion on a region between the first metal pixel driving line and the first metal data line, and
wherein in the light emission portion of the first subpixel, the upper surface of the overcoat layer includes the uneven pattern portion, and
wherein the third subpixel includes:
a light emission portion on a region between the reference voltage metal line and the third metal data line, and
wherein in the light emission portion of the third subpixel, the upper surface of the overcoat layer includes the uneven pattern portion.

10. The light emitting display apparatus of claim 9, wherein in the light emission portions of the third and fourth subpixels, the upper surface of the overcoat layer includes only the uneven pattern.

11. The light emitting display apparatus of claim 9, wherein the light emission portion of the first subpixel emits red light, the light emission portion of the second subpixel area emits white light, the light emission portion of the third subpixel emits blue light, and the light emission portion of the fourth subpixel emits green light.

12. The light emitting display apparatus of claim 1, wherein the second subpixel overlaps the first and second metal data lines and the reference voltage metal line, and wherein the fourth subpixel overlaps the third and fourth metal data lines and the second metal pixel driving line.

13. The light emitting display apparatus of claim 1, wherein a spacing distance between the first and second metal data line is the same as a spacing distance between the third and fourth metal data lines, wherein the spacing distance between the first and second metal data lines is less than a spacing distance between the first metal pixel driving line and the first metal data line, and wherein the spacing distance between the first metal pixel driving line and the first metal data line is equal to a distance between the reference voltage metal line and the third metal data line.

14. The light emitting display apparatus of claim 1, wherein the first subpixel includes:

a light emission portion on a region between the first metal pixel driving line and the first metal data line, and wherein in the light emission portion of the first subpixel, the upper surface of the overcoat layer includes the uneven pattern portion.

15. The light emitting display apparatus of claim 14, wherein the third subpixel includes:

a light emission portion on a region between the reference voltage metal line and the third metal data line, and wherein in the light emission portion of the third subpixel, the upper surface of the overcoat layer includes the uneven pattern portion.

16. The light emitting display apparatus of claim 15, wherein the fourth subpixel includes:

a first light emission portion disposed on a region between the fourth metal data line and the second metal pixel driving line; and a second light emission portion at a first side of the first light emission portion and overlapped with the third and fourth metal data lines and at a second side of the first light emission portion and overlapped with the second metal pixel driving line, wherein in the first light emission portion of the fourth subpixel, an upper surface of the overcoat layer includes the uneven pattern portion, and wherein in the second light emission portions of the fourth subpixel, the upper surface of the overcoat layer is flat.

17. The light emitting display apparatus of claim 1, wherein the first subpixel emits red light, the second subpixel emits white light, third subpixel emits blue light, and the fourth subpixel emits green light.

* * * * *